US012122251B2

(12) United States Patent
Glenn et al.

(10) Patent No.: US 12,122,251 B2
(45) Date of Patent: Oct. 22, 2024

(54) SYSTEMS AND METHODS FOR BIDIRECTIONAL MESSAGE ARCHITECTURE FOR INVERTER FOR ELECTRIC VEHICLE

(71) Applicant: Delphi Technologies IP Limited, St. Michael (BB)

(72) Inventors: Jack Lavern Glenn, Union Pier, MI (US); Mark Russell Keyse, Sharpsville, IN (US); Peter Allan Laubenstein, Sharpsville, IN (US); Srikanth Vijaykumar, Carmel, IN (US)

(73) Assignee: BorgWarner US Technologies LLC, Auburn Hills, MI (US)

( * ) Notice: Subject to any disclaimer, the term of this patent is extended or adjusted under 35 U.S.C. 154(b) by 107 days.

(21) Appl. No.: 18/057,890

(22) Filed: Nov. 22, 2022

(65) Prior Publication Data

US 2024/0106374 A1    Mar. 28, 2024

Related U.S. Application Data

(60) Provisional application No. 63/378,601, filed on Oct. 6, 2022, provisional application No. 63/377,512, filed
(Continued)

(51) Int. Cl.
  *B60L 50/60*    (2019.01)
  *B60L 3/00*     (2019.01)
  (Continued)

(52) U.S. Cl.
  CPC ............... *B60L 50/60* (2019.02); *B60L 3/003* (2013.01); *B60L 15/007* (2013.01); *B60L 15/08* (2013.01);
  (Continued)

(58) Field of Classification Search
  CPC .......... H02P 27/00; H02P 27/04; H02P 27/06; H02P 27/08; H02P 27/085; H02P 29/024;
  (Continued)

(56) References Cited

U.S. PATENT DOCUMENTS

| 4,054,828 A | 10/1977 | Conzelmann et al. |
| 4,128,801 A | 12/1978 | Gansert et al. |

(Continued)

FOREIGN PATENT DOCUMENTS

| EP | 3316461 B1 | 5/2018 |
| WO | 2007093598 A1 | 8/2007 |

(Continued)

OTHER PUBLICATIONS

Balogh, L., "Fundamentals of MOSFET and IGBT Gate Driver Circuits," Texas Instruments Application Report, SLUA618—Mar. 2017, Retrieved from internet URL: https://ghioni.faculty.polimi.it/pel/readmat/gate-drive.pdf, 65 pages.

(Continued)

*Primary Examiner* — Antony M Paul
(74) *Attorney, Agent, or Firm* — Joshua M. Haines; Bookoff McAndrews, PLLC

(57) ABSTRACT

A system includes an inverter configured to convert DC power from a battery to AC power to drive a motor, wherein the inverter includes: a galvanic interface configured to separate a high voltage area from a low voltage area; a low voltage message manager in the low voltage area; a high voltage message manager in the high voltage area, and configured to communicate with the low voltage message manager; and a point-of-use message manager in the high voltage area, and configured to communicate with the high voltage message manager.

20 Claims, 10 Drawing Sheets

Related U.S. Application Data on Sep. 28, 2022, provisional application No. 63/377,501, filed on Sep. 28, 2022, provisional application No. 63/377,486, filed on Sep. 28, 2022.

(51) Int. Cl.

| | |
|---|---|
| B60L 15/00 | (2006.01) |
| B60L 15/08 | (2006.01) |
| B60L 50/40 | (2019.01) |
| B60L 50/51 | (2019.01) |
| B60L 50/64 | (2019.01) |
| B60L 53/20 | (2019.01) |
| B60L 53/22 | (2019.01) |
| B60L 53/62 | (2019.01) |
| B60R 16/02 | (2006.01) |
| G01R 15/20 | (2006.01) |
| G06F 1/08 | (2006.01) |
| G06F 13/40 | (2006.01) |
| H01L 21/48 | (2006.01) |
| H01L 23/00 | (2006.01) |
| H01L 23/15 | (2006.01) |
| H01L 23/367 | (2006.01) |
| H01L 23/373 | (2006.01) |
| H01L 23/40 | (2006.01) |
| H01L 23/467 | (2006.01) |
| H01L 23/473 | (2006.01) |
| H01L 23/495 | (2006.01) |
| H01L 23/538 | (2006.01) |
| H01L 25/00 | (2006.01) |
| H01L 25/07 | (2006.01) |
| H01L 29/66 | (2006.01) |
| H02J 7/00 | (2006.01) |
| H02M 1/00 | (2007.01) |
| H02M 1/08 | (2006.01) |
| H02M 1/084 | (2006.01) |
| H02M 1/088 | (2006.01) |
| H02M 1/12 | (2006.01) |
| H02M 1/32 | (2007.01) |
| H02M 1/42 | (2007.01) |
| H02M 1/44 | (2007.01) |
| H02M 3/335 | (2006.01) |
| H02M 7/00 | (2006.01) |
| H02M 7/537 | (2006.01) |
| H02M 7/5387 | (2007.01) |
| H02M 7/5395 | (2006.01) |
| H02P 27/06 | (2006.01) |
| H02P 27/08 | (2006.01) |
| H02P 29/024 | (2016.01) |
| H02P 29/68 | (2016.01) |
| H05K 1/14 | (2006.01) |
| H05K 1/18 | (2006.01) |
| H05K 5/02 | (2006.01) |
| H05K 7/20 | (2006.01) |
| B60L 15/20 | (2006.01) |
| H03K 19/20 | (2006.01) |

(52) U.S. Cl.
CPC ............... *B60L 50/40* (2019.02); *B60L 50/51* (2019.02); *B60L 50/64* (2019.02); *B60L 53/20* (2019.02); *B60L 53/22* (2019.02); *B60L 53/62* (2019.02); *B60R 16/02* (2013.01); *G01R 15/20* (2013.01); *G06F 1/08* (2013.01); *G06F 13/4004* (2013.01); *H01L 21/4882* (2013.01); *H01L 23/15* (2013.01); *H01L 23/3672* (2013.01); *H01L 23/3675* (2013.01); *H01L 23/3735* (2013.01); *H01L 23/4006* (2013.01); *H01L 23/467* (2013.01); *H01L 23/473* (2013.01); *H01L 23/49562* (2013.01); *H01L 23/5383* (2013.01); *H01L 24/32* (2013.01); *H01L 24/33* (2013.01); *H01L 25/072* (2013.01); *H01L 25/50* (2013.01); *H01L 29/66553* (2013.01); *H02J 7/0063* (2013.01); *H02M 1/0009* (2021.05); *H02M 1/0054* (2021.05); *H02M 1/08* (2013.01); *H02M 1/084* (2013.01); *H02M 1/088* (2013.01); *H02M 1/123* (2021.05); *H02M 1/32* (2013.01); *H02M 1/322* (2021.05); *H02M 1/327* (2021.05); *H02M 1/4258* (2013.01); *H02M 1/44* (2013.01); *H02M 3/33523* (2013.01); *H02M 7/003* (2013.01); *H02M 7/537* (2013.01); *H02M 7/5387* (2013.01); *H02M 7/53871* (2013.01); *H02M 7/53875* (2013.01); *H02M 7/5395* (2013.01); *H02P 27/06* (2013.01); *H02P 27/08* (2013.01); *H02P 27/085* (2013.01); *H02P 29/024* (2013.01); *H02P 29/027* (2013.01); *H02P 29/68* (2016.02); *H05K 1/145* (2013.01); *H05K 1/181* (2013.01); *H05K 1/182* (2013.01); *H05K 5/0247* (2013.01); *H05K 7/20154* (2013.01); *H05K 7/2049* (2013.01); *H05K 7/20854* (2013.01); *H05K 7/209* (2013.01); *H05K 7/20927* (2013.01); *B60L 15/20* (2013.01); *B60L 2210/30* (2013.01); *B60L 2210/40* (2013.01); *B60L 2210/42* (2013.01); *B60L 2210/44* (2013.01); *B60L 2240/36* (2013.01); *G06F 2213/40* (2013.01); *H01L 2023/405* (2013.01); *H01L 2023/4087* (2013.01); *H01L 2224/32225* (2013.01); *H01L 2224/32245* (2013.01); *H01L 2224/33181* (2013.01); *H02J 2207/20* (2020.01); *H02P 2207/05* (2013.01); *H03K 19/20* (2013.01); *H05K 2201/042* (2013.01); *H05K 2201/10166* (2013.01)

(58) Field of Classification Search
CPC ........ H02P 29/60; H02P 29/68; H02P 25/062; H02P 25/022; H02P 25/08; H02P 25/092; H02P 25/107; H02P 21/36; H02P 7/00; H02P 7/29; H02P 6/08; H02P 6/12; H02P 1/24; H02P 1/42; H02P 1/46; H02P 29/027; H02P 2207/05; H02P 29/0241; H02P 29/026; H02M 1/123; H02M 1/0009; H02M 3/33523; H02M 7/53871; B60L 2210/30; B60L 2210/40; B60L 2210/42; B60L 2210/44; B60L 3/003; B60L 50/51; B60L 50/60; B60R 16/033
See application file for complete search history.

(56) References Cited

U.S. PATENT DOCUMENTS

| | | |
|---|---|---|
| 4,564,771 A | 1/1986 | Flohrs |
| 4,618,875 A | 10/1986 | Flohrs |
| 4,716,304 A | 12/1987 | Fiebig et al. |
| 5,068,703 A | 11/1991 | Conzelmann et al. |
| 5,432,371 A | 7/1995 | Denner et al. |
| 5,559,661 A | 9/1996 | Meinders |
| 5,654,863 A | 8/1997 | Davies |
| 5,764,007 A | 6/1998 | Jones |
| 5,841,312 A | 11/1998 | Mindl et al. |
| 5,900,683 A | 5/1999 | Rinehart et al. |
| 6,028,470 A | 2/2000 | Michel et al. |
| 6,163,138 A | 12/2000 | Kohl et al. |
| 6,351,173 B1 | 2/2002 | Ovens et al. |

(56) References Cited

U.S. PATENT DOCUMENTS

| | | |
|---|---|---|
| 6,426,857 B1 | 7/2002 | Doster et al. |
| 6,597,556 B1 | 7/2003 | Michel et al. |
| 6,812,553 B2 | 11/2004 | Gerbsch et al. |
| 6,943,293 B1 | 9/2005 | Jeter et al. |
| 7,095,098 B2 | 8/2006 | Gerbsch et al. |
| 7,229,855 B2 | 6/2007 | Murphy |
| 7,295,433 B2 | 11/2007 | Taylor et al. |
| 7,459,954 B2 | 12/2008 | Kuehner et al. |
| 7,538,425 B2 | 5/2009 | Myers et al. |
| 7,551,439 B2 | 6/2009 | Peugh et al. |
| 7,616,047 B2 | 11/2009 | Rees et al. |
| 7,724,046 B2 | 5/2010 | Wendt et al. |
| 7,750,720 B2 | 7/2010 | Dittrich |
| 8,502,420 B1 | 8/2013 | Mogilevski |
| 9,088,159 B2 | 7/2015 | Peuser |
| 9,275,915 B2 | 3/2016 | Heinisch et al. |
| 9,373,970 B2 | 6/2016 | Feuerstack et al. |
| 9,431,932 B2 | 8/2016 | Schmidt et al. |
| 9,515,584 B2 | 12/2016 | Koller et al. |
| 9,548,675 B2 | 1/2017 | Schoenknecht |
| 9,806,607 B2 | 10/2017 | Ranmuthu et al. |
| 9,843,320 B2 | 12/2017 | Richter et al. |
| 9,871,444 B2 | 1/2018 | Ni et al. |
| 9,882,490 B2 | 1/2018 | Veeramreddi et al. |
| 10,111,285 B2 | 10/2018 | Shi et al. |
| 10,116,300 B2 | 10/2018 | Blasco et al. |
| 10,169,278 B2 | 1/2019 | Mori et al. |
| 10,232,718 B2 | 3/2019 | Trunk et al. |
| 10,270,354 B1 | 4/2019 | Lu et al. |
| 10,291,225 B2 | 5/2019 | Li et al. |
| 10,361,934 B2 | 7/2019 | Elend et al. |
| 10,525,847 B2 | 1/2020 | Strobel et al. |
| 10,797,579 B2 | 10/2020 | Hashim et al. |
| 10,924,001 B2 | 2/2021 | Li et al. |
| 11,082,052 B2 | 8/2021 | Jang et al. |
| 11,108,389 B2 | 8/2021 | Li et al. |
| 11,342,911 B2 | 5/2022 | Lee et al. |
| 11,838,011 B2 | 12/2023 | Li et al. |
| 11,843,320 B2 | 12/2023 | Sivakumar et al. |
| 11,848,426 B2 | 12/2023 | Zhang et al. |
| 11,851,038 B2 | 12/2023 | Solanki et al. |
| 11,855,522 B2 | 12/2023 | Rudolph et al. |
| 11,855,630 B2 | 12/2023 | Dake et al. |
| 11,870,338 B1 | 1/2024 | Narayanasamy |
| 11,872,997 B2 | 1/2024 | Hoos et al. |
| 11,881,859 B2 | 1/2024 | Gupta et al. |
| 11,888,391 B2 | 1/2024 | Balasubramanian et al. |
| 11,888,393 B2 | 1/2024 | Venkateswaran et al. |
| 11,901,803 B2 | 2/2024 | Ruck et al. |
| 11,901,881 B1 | 2/2024 | Narayanasamy |
| 11,909,319 B2 | 2/2024 | Esteghlal et al. |
| 11,916,426 B2 | 2/2024 | Oner et al. |
| 11,923,762 B2 | 3/2024 | Sethumadhavan et al. |
| 11,923,764 B1 | 3/2024 | Zhang |
| 11,923,799 B2 | 3/2024 | Ojha et al. |
| 11,925,119 B2 | 3/2024 | Male et al. |
| 11,927,624 B2 | 3/2024 | Patel et al. |
| 11,938,838 B2 | 3/2024 | Simonis et al. |
| 11,942,927 B2 | 3/2024 | Purcarea et al. |
| 11,942,934 B2 | 3/2024 | Ritter |
| 11,945,331 B2 | 4/2024 | Blemberg et al. |
| 11,945,522 B2 | 4/2024 | Matsumura et al. |
| 11,949,320 B2 | 4/2024 | Jaladanki et al. |
| 11,949,333 B2 | 4/2024 | Pahkala et al. |
| 11,955,896 B2 | 4/2024 | Liu et al. |
| 11,955,953 B2 | 4/2024 | Sinn et al. |
| 11,955,964 B2 | 4/2024 | Agarwal et al. |
| 11,962,234 B2 | 4/2024 | Narayanasamy et al. |
| 11,962,291 B2 | 4/2024 | Oberdieck et al. |
| 11,964,587 B2 | 4/2024 | Yukawa |
| 11,970,076 B2 | 4/2024 | Sarfert et al. |
| 11,977,404 B2 | 5/2024 | Chandrasekaran |
| 11,984,802 B2 | 5/2024 | Merkin et al. |
| 11,984,876 B2 | 5/2024 | Neidorff et al. |
| 11,990,776 B2 | 5/2024 | Dulle |
| 11,990,777 B2 | 5/2024 | Woll et al. |
| 11,996,686 B2 | 5/2024 | Chan et al. |
| 11,996,699 B2 | 5/2024 | Vasconcelos Araujo et al. |
| 11,996,714 B2 | 5/2024 | El Markhi et al. |
| 11,996,715 B2 | 5/2024 | Nandi et al. |
| 11,996,762 B2 | 5/2024 | Hembach et al. |
| 11,996,830 B2 | 5/2024 | Murthy et al. |
| 11,996,847 B1 | 5/2024 | Kazama et al. |
| 12,003,191 B2 | 6/2024 | Chaudhary et al. |
| 12,003,229 B2 | 6/2024 | Kaya et al. |
| 12,003,237 B2 | 6/2024 | Waters |
| 12,008,847 B2 | 6/2024 | Braun et al. |
| 12,009,679 B2 | 6/2024 | Gottwald et al. |
| 12,012,057 B2 | 6/2024 | Schneider et al. |
| 12,015,342 B2 | 6/2024 | Kienzler et al. |
| 12,019,112 B2 | 6/2024 | Jarmolowitz et al. |
| 12,021,517 B2 | 6/2024 | S et al. |
| 2009/0174353 A1 | 7/2009 | Nakamura et al. |
| 2017/0331469 A1 | 11/2017 | Kilb et al. |
| 2020/0195121 A1 | 6/2020 | Keskar et al. |
| 2021/0005711 A1 | 1/2021 | Martinez-Limia et al. |
| 2022/0052610 A1 | 2/2022 | Plum |
| 2022/0294441 A1 | 9/2022 | Purcarea et al. |
| 2023/0010616 A1 | 1/2023 | Gschwantner et al. |
| 2023/0061922 A1 | 3/2023 | Ritter |
| 2023/0082076 A1 | 3/2023 | Strache et al. |
| 2023/0126070 A1 | 4/2023 | Oberdieck et al. |
| 2023/0145214 A1* | 5/2023 | Walker ............... B60T 13/662 701/22 |
| 2023/0179198 A1 | 6/2023 | Winkler |
| 2023/0231210 A1 | 7/2023 | Joos et al. |
| 2023/0231400 A1 | 7/2023 | Oberdieck et al. |
| 2023/0231496 A1 | 7/2023 | Syed et al. |
| 2023/0238808 A1 | 7/2023 | Swoboda et al. |
| 2023/0268826 A1 | 8/2023 | Yan et al. |
| 2023/0335509 A1 | 10/2023 | Poddar |
| 2023/0365086 A1 | 11/2023 | Schumacher et al. |
| 2023/0370062 A1 | 11/2023 | Wolf |
| 2023/0378022 A1 | 11/2023 | Kim et al. |
| 2023/0386963 A1 | 11/2023 | Kim et al. |
| 2023/0402930 A1 | 12/2023 | Corry et al. |
| 2023/0420968 A1 | 12/2023 | Oner et al. |
| 2023/0421049 A1 | 12/2023 | Neidorff |
| 2024/0006869 A1 | 1/2024 | Kim et al. |
| 2024/0006899 A1 | 1/2024 | Wernerus |
| 2024/0006993 A1 | 1/2024 | Barjati et al. |
| 2024/0022187 A1 | 1/2024 | Fassnacht |
| 2024/0022240 A1 | 1/2024 | Balaz |
| 2024/0022244 A1 | 1/2024 | S et al. |
| 2024/0030730 A1 | 1/2024 | Wernerus |
| 2024/0039062 A1 | 2/2024 | Wernerus |
| 2024/0039402 A1 | 2/2024 | Bafna et al. |
| 2024/0039406 A1 | 2/2024 | Chen et al. |
| 2024/0048048 A1 | 2/2024 | Zhang |
| 2024/0055488 A1 | 2/2024 | Lee et al. |
| 2024/0067116 A1 | 2/2024 | Qiu |
| 2024/0072675 A1 | 2/2024 | Formenti et al. |
| 2024/0072817 A1 | 2/2024 | K et al. |
| 2024/0077899 A1 | 3/2024 | Chitnis et al. |
| 2024/0078204 A1 | 3/2024 | Roehrle et al. |
| 2024/0079950 A1 | 3/2024 | Narayanasamy |
| 2024/0079958 A1 | 3/2024 | Kumar et al. |
| 2024/0080028 A1 | 3/2024 | Dake et al. |
| 2024/0088647 A1 | 3/2024 | Ramadass et al. |
| 2024/0088896 A1 | 3/2024 | Bilhan et al. |
| 2024/0097437 A1 | 3/2024 | Goyal et al. |
| 2024/0097459 A1 | 3/2024 | Swoboda et al. |
| 2024/0105276 A1 | 3/2024 | Duryea |
| 2024/0106248 A1 | 3/2024 | Woll et al. |
| 2024/0106435 A1 | 3/2024 | Zhang et al. |
| 2024/0113517 A1 | 4/2024 | Sriraj et al. |
| 2024/0113611 A1 | 4/2024 | Kaufmann et al. |
| 2024/0113620 A1 | 4/2024 | Ranmuthu et al. |
| 2024/0113624 A1 | 4/2024 | Southard et al. |
| 2024/0120558 A1 | 4/2024 | Zhang et al. |
| 2024/0120765 A1 | 4/2024 | Oner et al. |
| 2024/0120962 A1 | 4/2024 | Miriyala et al. |
| 2024/0128851 A1 | 4/2024 | Ruck et al. |
| 2024/0128859 A1 | 4/2024 | Chen |

(56) References Cited

U.S. PATENT DOCUMENTS

| | | |
|---|---|---|
| 2024/0128867 A1 | 4/2024 | Wang et al. |
| 2024/0146177 A1 | 5/2024 | Mehdi et al. |
| 2024/0146306 A1 | 5/2024 | Ramkaj et al. |
| 2024/0149734 A1 | 5/2024 | Eisenlauer |
| 2024/0162723 A1 | 5/2024 | Zipf et al. |
| 2024/0178756 A1 | 5/2024 | El-Markhi et al. |
| 2024/0178824 A1 | 5/2024 | Kazama et al. |
| 2024/0186803 A1 | 6/2024 | Krieg et al. |
| 2024/0198937 A1 | 6/2024 | Benqassmi et al. |
| 2024/0198938 A1 | 6/2024 | Carlos et al. |
| 2024/0204540 A1 | 6/2024 | Majmunovic et al. |
| 2024/0204541 A1 | 6/2024 | Majmunovic et al. |
| 2024/0204671 A1 | 6/2024 | Liu et al. |
| 2024/0204765 A1 | 6/2024 | Dake |
| 2024/0213874 A1 | 6/2024 | Junnarkar et al. |
| 2024/0213971 A1 | 6/2024 | Lee |
| 2024/0213975 A1 | 6/2024 | Narayanasamy |
| 2024/0213981 A1 | 6/2024 | Agarwal et al. |

FOREIGN PATENT DOCUMENTS

| | | |
|---|---|---|
| WO | 2019034505 A1 | 2/2019 |
| WO | 2020156820 A1 | 8/2020 |
| WO | 2020239797 A1 | 12/2020 |
| WO | 2021110405 A1 | 6/2021 |
| WO | 2021213728 A1 | 10/2021 |
| WO | 2022012943 A1 | 1/2022 |
| WO | 2022229149 A1 | 11/2022 |
| WO | 2023006491 A1 | 2/2023 |
| WO | 2023046607 A1 | 3/2023 |
| WO | 2023094053 A1 | 6/2023 |
| WO | 2023110991 A1 | 6/2023 |
| WO | 2023147907 A1 | 8/2023 |
| WO | 2023151850 A1 | 8/2023 |
| WO | 2023227278 A1 | 11/2023 |
| WO | 2023237248 A1 | 12/2023 |
| WO | 2024006181 A2 | 1/2024 |
| WO | 2024012743 A1 | 1/2024 |
| WO | 2024012744 A1 | 1/2024 |
| WO | 2024022219 A1 | 2/2024 |
| WO | 2024041776 A1 | 2/2024 |
| WO | 2024046614 A1 | 3/2024 |
| WO | 2024049730 A1 | 3/2024 |
| WO | 2024049884 A1 | 3/2024 |
| WO | 2024049909 A1 | 3/2024 |
| WO | 2024056388 A1 | 3/2024 |
| WO | 2024068065 A1 | 4/2024 |
| WO | 2024068076 A1 | 4/2024 |
| WO | 2024068113 A1 | 4/2024 |
| WO | 2024068115 A1 | 4/2024 |
| WO | 2024083391 A1 | 4/2024 |
| WO | 2024093384 A1 | 5/2024 |
| WO | 2024104970 A1 | 5/2024 |
| WO | 2024108401 A1 | 5/2024 |
| WO | 2024110106 A1 | 5/2024 |
| WO | 2024110265 A1 | 5/2024 |
| WO | 2024110297 A1 | 5/2024 |
| WO | 2024114978 A1 | 6/2024 |
| WO | 2024114979 A1 | 6/2024 |
| WO | 2024114980 A1 | 6/2024 |
| WO | 2024128286 A1 | 6/2024 |
| WO | 2024132249 A1 | 6/2024 |

OTHER PUBLICATIONS

Baranwal, S., "Common-mode transient immunity for isolated gate drivers," Analog Applications Journal, Texas Instruments (2015), Retrieved from internet URL: https://www.ti.com/lit/an/slyt648/slyt648.pdf?ts=1702052336068&ref_url=https%253A%252F%252Fwww.google.com%252F, 07 pages.

Boomer, K. and Ahmad H., "Performance Evaluation of an Automotive-Grade, High-Speed Gate Driver for SiC FETs, Type UCC27531, Over a Wide Temperature Range," NASA Electronic Parts and Packaging Program No. GRC-E-DAA-TN25898 (2015), Retrieved from Internet URL: https://ntrs.nasa.gov/api/citations/20150023034/downloads/20150023034.pdf, 08 pages.

Ke, X, et al., "A 3-to-40V 10-to-30MHz Automotive-Use GaN Driver with Active BST Balancing and VSW Dual-Edge Dead-Time Modulation Achieving 8.3% Efficiency Improvement and 3.4ns Constant Propagation Delay," 2016 IEEE International Solid-State Circuits Conference (ISSCC), IEEE, 2016, Retrieved from internet URL: https://picture.iczhiku.com/resource/ieee/WYkrsJrSQPoSjNXm.pdf, 03 pages.

Sridhar, N., "Impact of an Isolated Gate Driver," Texas Instruments: Dallas, Texas (2019), Retrieved from Internet URL: https://www.ti.com/lit/wp/slyy140a/slyy140a.pdf, 08 pages.

Sridhar, N., "Power Electronics in Motor Drives: Where is it?" Texas Instruments (2015), Retrieved from Internet URL: https://www.ti.com/lit/wp/slyy078a/slyy078a.pdf, 09 pages.

Sridhar, N., "Silicon Carbide Gate Drivers—a Disruptive Technology in Power Electronics," Texas Instruments, Dallas, Texas (2019), Retrieved from Internet URL: https://www.ti.com/lit/wp/slyy139/slyy139.pdf, 07 pages.

Maniar, K., et al., "Addressing High-voltage Design Challenges With Reliable and Affordable Isolation Technologies," 2024, pp. 1-12. Retrieved from internet URL: https://www.ti.com/lit/wp/slyy204c/slyy204c.pdf ts=1710508127616&ref_url=https%253A%252F%252Fwww.google.com%252F.

"New products," 5 Pages, Retrieved from internet URL:https://www.ti.com/product-category/new-products.html?%20releasePeriod=364#releasePeriod=90.

"Qualcomm and Bosch Showcase New Central Vehicle Computer for Digital Cockpit and Driver Assistance Functions at CES 2024," 2024, 8 Pages. Retrieved from internet URL:https://www.qualcomm.com/news/releases/2024/01/qualcomm-and-bosch-showcase-new-central-vehicle-computer-for-dig.

"Integrated circuits—EMC evaluation of transceivers—Part 2: LIN transceivers", International Standard, IEC 62228-2, International Electrotechnical Commission (IEC), 2016 (90 pages).

"Integrated circuits—EMC evaluation of transceivers—Part 3: CAN transceivers", International Standard, IEC 62228-3, International Electrotechnical Commission (IEC), 2019 (160 pages).

LIN Specification Package Revision 2.2A, LIN Consortium, 2010 (194 pages).

"Road vehicles—Controller area network (CAN)—Part 2: High-speed medium access unit", ISO 11898-2, International Standard, 2016 (32 pages).

* cited by examiner

SYSTEMS AND METHODS FOR BIDIRECTIONAL MESSAGE ARCHITECTURE FOR INVERTER FOR ELECTRIC VEHICLE

CROSS-REFERENCE TO RELATED APPLICATION(S)

This application claims the benefit of priority to U.S. Provisional Patent Application No. 63/377,486, filed Sep. 28, 2022, U.S. Provisional Patent Application No. 63/377,501, filed Sep. 28, 2022, U.S. Provisional Patent Application No. 63/377,512, filed Sep. 28, 2022, and U.S. Provisional Patent Application No. 63/378,601, filed Oct. 6, 2022, the entireties of which are incorporated by reference herein.

TECHNICAL FIELD

Various embodiments of the present disclosure relate generally to electrical circuit communication architecture and, more particularly, to bidirectional communication architecture for tolerating coupled currents.

BACKGROUND

Inverters, such as those used to drive a motor in an electric vehicle, for example, are responsible for converting High Voltage Direct Current (HVDC) into Alternating Current (AC) to drive the motor. Common-mode transients occur during power device switching and when one side of a floating high voltage battery terminal is shorted to ground or subject to an electro-static discharge. These voltage transients result in fast edges, which create bursts of common-mode current through the galvanic isolation, and affect an operation of the gate drivers.

The present disclosure is directed to overcoming one or more of these above-referenced challenges.

SUMMARY OF THE DISCLOSURE

In some aspects, the techniques described herein relate to a system including: an inverter configured to convert DC power from a battery to AC power to drive a motor, wherein the inverter includes: a galvanic interface configured to separate a high voltage area from a low voltage area; a low voltage message manager in the low voltage area; a high voltage message manager in the high voltage area, and configured to communicate with the low voltage message manager; and a point-of-use message manager in the high voltage area, and configured to communicate with the high voltage message manager.

In some aspects, the techniques described herein relate to a system, further including: the battery configured to supply the DC power to the inverter; and the motor configured to receive the AC power from the inverter to drive the motor.

In some aspects, the techniques described herein relate to a system, wherein the point-of-use message manager is in a power module including one or more power device switches for the inverter, and wherein the inverter further includes: a single-wire data bus connecting the high voltage message manager to the point-of-use message manager, wherein the point-of-use message manager is configured to communicate with the high voltage message manager using the single-wire data bus, and a timer configured to measure a period of time that the single-wire data bus is in a dominant phase or a recessive phase, wherein the low voltage message manager, the high voltage message manager, and the point-of-use message manager are configured to communicate using a logic 0 bit and a logic 1 bit, wherein the logic 0 bit is defined as a dominant phase measured by the timer for a first period of time followed by a recessive phase measured for a second period of time, and the logic 1 bit is defined as a dominant phase measured by the timer for the first period of time followed by a recessive phase measured for a third period of time that is longer than the second period of time for the logic 0 bit.

In some aspects, the techniques described herein relate to a system including: a galvanic interface configured to separate a high voltage area from a low voltage area; a low voltage message manager in the low voltage area; a high voltage message manager in the high voltage area, and configured to communicate with the low voltage message manager; and a point-of-use message manager in the high voltage area, and configured to communicate with the high voltage message manager.

In some aspects, the techniques described herein relate to a system, further including: a single-wire data bus connecting the high voltage message manager to the point-of-use message manager, wherein the point-of-use message manager is configured to communicate with the high voltage message manager using the single-wire data bus.

In some aspects, the techniques described herein relate to a system, further including: a first switched current source configured to operate with the high voltage message manager to drive the single-wire data bus to a power rail; a second switched current source configured to operate with the point-of-use message manager to drive the single-wire data bus to the power rail; a third switched current sink configured to operate with the high voltage message manager to drive the single-wire data bus to a ground rail; and a fourth switched current sink configured to operate with the point-of-use message manager to drive the single-wire data bus to the ground rail.

In some aspects, the techniques described herein relate to a system, wherein one or more of the first switched current source or the second switched current source is configured to overdrive a state of the single-wire data bus as driven by an operation of the third switched current sink or the fourth switched current sink, or wherein one or more of the third switched current sink or the fourth switched current sink is configured to overdrive a state of the single-wire data bus as driven by an operation of the first switched current source or the second switched current source.

In some aspects, the techniques described herein relate to a system, wherein the first switched current source, the second switched current source, the third switched current sink, and the fourth switched current sink have a higher current capability than an expected worst case externally coupled current.

In some aspects, the techniques described herein relate to a system, further including: a first comparator configured to operate with the high voltage message manager to differentiate a high state or a low state of the single-wire data bus; and a second comparator configured to operate with the point-of-use message manager to differentiate a high state or a low state of the single-wire data bus.

In some aspects, the techniques described herein relate to a system, wherein the point-of-use message manager is in a power module including one or more power device switches for an inverter.

In some aspects, the techniques described herein relate to a system, wherein one or more of the low voltage message manager, the high voltage message manager, or the point-of-use message manager includes a timer configured to measure a period of time that the single-wire data bus is in a dominant phase or a recessive phase.

In some aspects, the techniques described herein relate to a system, wherein the low voltage message manager, the high voltage message manager, and the point-of-use message manager are configured to communicate using a logic 0 bit and a logic 1 bit, wherein the logic 0 bit is defined as a dominant phase measured by the timer for a first period of time followed by a recessive phase measured for a second period of time, and the logic 1 bit is defined as a dominant phase measured by the timer for the first period of time followed by a recessive phase measured for a third period of time that is longer than the second period of time for the logic 0 bit.

In some aspects, the techniques described herein relate to a system, wherein an interrupting manager, among the low voltage message manager, the high voltage message manager, and the point-of-use message manager, is configured to interrupt a transmitting manager, among the low voltage message manager, the high voltage message manager, and the point-of-use message manager, by transmitting a logic 0 bit or a logic 1 bit during the second period of time or the third period of time, and the transmitting manager is configured to yield communication to the interrupting manager within a single bit transmission.

In some aspects, the techniques described herein relate to a system, wherein the low voltage message manager, the high voltage message manager, and the point-of-use message manager are configured to communicate with any of other managers among the low voltage message manager, the high voltage message manager, and the point-of-use message manager.

In some aspects, the techniques described herein relate to a method for communicating with power device switches for an inverter, the method including: communicating a message between a high voltage message manager of the inverter and a point-of-use message manager for the power device switches using a single-wire data bus.

In some aspects, the techniques described herein relate to a method, further including: measuring, with a timer of the inverter, a period of time that the single-wire data bus is in a dominant phase or a recessive phase.

In some aspects, the techniques described herein relate to a method, wherein the communicating the message includes using a logic 0 bit and a logic 1 bit, wherein the logic 0 bit is defined as a dominant phase measured by the timer for a first period of time followed by a recessive phase measured for a second period of time, and the logic 1 bit is defined as a dominant phase measured by the timer for the first period of time followed by a recessive phase measured for a third period of time that is longer than the second period of time for the logic 0 bit.

In some aspects, the techniques described herein relate to a method, further including transmitting a logic 0 bit or a logic 1 bit during the second period of time or the third period of time, to interrupt a message communication within a single bit transmission.

In some aspects, the techniques described herein relate to a method, further including: applying one or more of a current source or a current sink to the single-wire data bus.

In some aspects, the techniques described herein relate to a method, wherein the one or more of the current source or the current sink has a higher current capability than an expected worst case externally coupled current.

Additional objects and advantages of the disclosed embodiments will be set forth in part in the description that follows, and in part will be apparent from the description, or may be learned by practice of the disclosed embodiments. The objects and advantages of the disclosed embodiments will be realized and attained by means of the elements and combinations particularly pointed out in the appended claims.

It is to be understood that both the foregoing general description and the following detailed description are exemplary and explanatory only and are not restrictive of the disclosed embodiments, as claimed.

BRIEF DESCRIPTION OF THE DRAWINGS

The accompanying drawings, which are incorporated in and constitute a part of this specification, illustrate various exemplary embodiments and together with the description, serve to explain the principles of the disclosed embodiments.

DETAILED DESCRIPTION OF EMBODIMENTS

Figure 1:
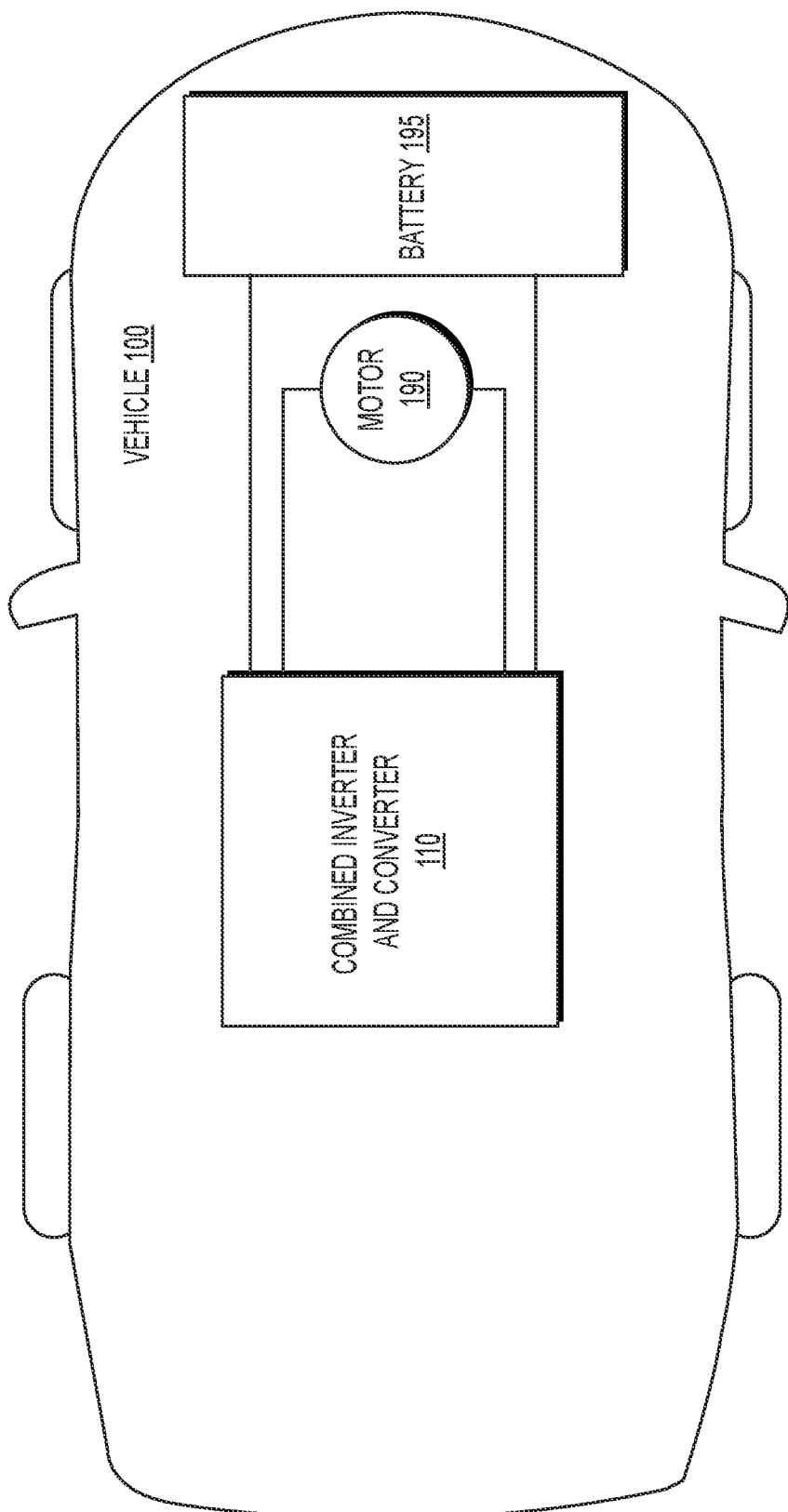
FIG. 1 depicts an exemplary system infrastructure for a vehicle including a combined inverter and converter, according to one or more embodiments.

Both the foregoing general description and the following detailed description are exemplary and explanatory only and are not restrictive of the features, as claimed. As used herein, the terms "comprises," "comprising," "has," "having," "includes," "including," or other variations thereof, are intended to cover a non-exclusive inclusion such that a process, method, article, or apparatus that comprises a list of elements does not include only those elements, but may include other elements not expressly listed or inherent to such a process, method, article, or apparatus. In this disclosure, unless stated otherwise, relative terms, such as, for example, "about," "substantially," and "approximately" are used to indicate a possible variation of ±10% in the stated value. In this disclosure, unless stated otherwise, any numeric value may include a possible variation of ±10% in the stated value.

The terminology used below may be interpreted in its broadest reasonable manner, even though it is being used in conjunction with a detailed description of certain specific examples of the present disclosure. Indeed, certain terms may even be emphasized below; however, any terminology intended to be interpreted in any restricted manner will be overtly and specifically defined as such in this Detailed Description section. For example, in the context of the disclosure, the switching devices may be described as switches or devices, but may refer to any device for controlling the flow of power in an electrical circuit. For example, switches may be metal-oxide-semiconductor field-effect transistors (MOSFETs), bipolar junction transistors (BJTs), insulated-gate bipolar transistors (IGBTs), or relays, for example, or any combination thereof, but are not limited thereto.

Various embodiments of the present disclosure relate generally to electrical circuit communication architecture and, more particularly, to bidirectional communication architecture for tolerating coupled currents.

Inverters, such as those used to drive a motor in an electric vehicle, for example, are responsible for converting High Voltage Direct Current (HVDC) into Alternating Current (AC) to drive the motor. A three phase inverter may include a bridge with six power device switches (for example, power transistors such as IGBT or MOSFET) that are controlled by Pulse Width Modulation (PWM) signals generated by a controller. An inverter may include three half-H bridge switches to control the phase voltage, upper and lower gate drivers to control the switches, a PWM controller, and glue logic between the PWM controller and the gate drivers. The PWM controller may generate signals to define the intended states of the system. The gate drivers may send the signals from the PWM controller to the half-H bridge switches. The half-H bridge switches may drive the phase voltage. The inverter may include an isolation barrier between low voltage and high voltage planes. Signals may pass from the PWM controller to the half-H bridge switches by passing across the isolation barrier, which may employ optical, transformer-based, or capacitance-based isolation. PWM signals may be distorted when passing through the glue logic, which may include resistive, capacitive, or other types of filtering. PWM signals may be distorted when passing through the gate driver, due to the galvanic isolation barrier and other delays within the gate driver. PWM signals may be distorted when the signals processed by the half-H switch via the gate driver output.

Gate drivers may tolerate common-mode transients that occur during field-effect transistor (FET) switching and when one side of the floating high voltage terminal is shorted to ground or subject to an electro-static discharge. These voltage transients may result in fast edges, which may create bursts of common-mode current through the galvanic isolation. A gate driver may need to demonstrate common-mode transient immunity (CMTI) in order to be effective and safe.

Gate drivers may have a high-voltage domain in common to the voltage plane of an associated FET. Further, high-voltage planes may be supplied by a flyback converter that may be isolated through a transformer from the low-voltage plane. The high-voltage domain supply may be used to power circuits which source and sink gate current to drive the FET and which may detect FET faults so the faults can be acted upon and/or communicated to the low-voltage domain. Gate drivers may include a galvanic channel dedicated to FET commands, and one or more bidirectional or unidirectional galvanic channels dedicated to FET communications.

High current switching transients may create strong electro-magnetic (EM) fields that may couple into nearby metal traces. The magnitude and frequency of coupled currents may depend upon the layout of the FET packaging solution and the direction and length of metal traces between the FET and the control integrated circuit (IC). For example, typical values for coupled currents may be up to 1 A at AC frequencies up to 100 MHz. Typically, within a circuit, the gate driver IC may be placed far enough away from the FET that high EM fields do not couple directly into the internal metal traces within the gate driver IC. The gate driver is placed a distance from EM fields such that induced currents within the circuitry are below levels that will cause malfunction of the gate driver, or a metal shield is placed between the gate driver and the source of EM fields to protect the gate driver circuitry. The output terminals of the gate driver that connect to the FET are exposed to the EM fields at the point where the output terminals are no longer covered by a shield. The gate driver switches large currents (such as 5 A to 15 A, for example) through these exposed terminals. The switched large currents are generally greater in magnitude than the EM-induced currents. The gate driver is able to overdrive the induced currents to maintain control of the FETs. The high side of the gate drivers and the FET may share a common ground and a gate control signal trace, both of which may be susceptible to coupled currents.

Gate drivers may turn on low-resistance switches to source and sink gate currents. Series resistors may sometimes be added to limit gate current. Switched gate currents may be larger than coupled currents in order to maintain control of their respective FETs.

Gate drivers may be able to sense FET operating voltages or currents in order to provide feedback and react to faults. Over-current faults may typically be detected by sensing the FET drain to source voltage and comparing the sensed voltage to a reference value. Sensed voltages may be heavily filtered to reject coupled currents. Filtering may slow down the response to fault conditions, resulting in delays in response. For example, the rate of current increase due to a low resistance short circuit may reach damaging levels prior to being detected by the heavily filtered drain to source voltage detection strategy. The resulting short circuit may damage the FET or the vehicle, prior to being detected and shut off.

According to one or more embodiments, a FET driver circuit may provide rapid over-current detection by either shunt current sensing or by diverting a fraction of the load current through a parallel FET that may have a current sensing circuit. Utilizing either strategy may require a "point-of-use IC" where sensing circuitry is in close proximity to the FET. Even if a point-of-use IC and a remote controller are resistant to EM fields, communication between the point-of-use IC and remote controller remains susceptible to induced currents. Point-of-use ICs have been implemented in low EM field applications, such as smart FETs for automotive applications. However, point-of-use ICs have not been used in high EM field applications, due to a lack of a high-speed messaging architecture that is robust against coupled currents. A high EM field may be a field (i) that induces a current within an IC that is in excess of an operating current of the IC and leads to malfunction, or (ii) that induces a differential voltage within an IC which is in excess of the operating differential voltage and leads to malfunction. A high EM field may be a field that is greater than approximately 10 A or approximately 100V, for example.

According to one or more embodiments, a high-speed, bidirectional communication architecture may tolerate coupled currents in order to enable point-of-use ICs to be placed in high EM field applications. The point-of-use ICs may reduce the detection and response times to allow for safe control and management of FETs within the inverter systems.

Some architectures may disclose an isolation between a microcontroller in a primary plane and a load in a secondary plane that may be controlled by a switch. This isolation is achieved by transformers, which may be inherently susceptible to induced currents, which are generated by an EM field during high current switching of the loads. Some architectures may not compensate for induced currents within the transformer primary or secondary. Some communication architectures designed to tolerate EM disturbances may include Local Interconnect Networks (LIN) and controller area network (CAN) systems.

A LIN single-wire bus architecture uses required external elements that may be connected to the LIN bus. These systems may describe the LIN architecture with a maximum data rate of 20 kB/s, where a bus low state is a logic 0 and a bus high state is a logic 1. The bus may be passively pulled up to a higher voltage using a 1 kOhm resistor and actively pulled down to a lower voltage using a switch with a maximum specified current limit of 200 mA. LIN driver current may be too low to reject coupled current, which may range from 100 mA to 1 A.

A CAN architecture has a two wire bus using passive bus load resistors and a message protocol. CAN architecture may have a maximum data rate of 5 MB/S, where a bus driver to a differential stage is a logic 0 and a bus passively pulled together is a logic 1. The bus may be passively pulled together using 120 Ohm termination resistors on either end of the bus and actively pulled down using a switch with a maximum specified current limit of 100 mA. The CAN bus may use a twisted pair architecture which may have a high common-mode rejection to coupled currents, unless the currents are so high as to rail the maximum voltage of the bus against the electrostatic discharge clamps. A 1 A induced current may be more than enough to rail the CAN bus in this manner, and thus CAN may not be an acceptable architecture for high EM field applications.

According to one or more embodiments, the problem of communication through large coupled currents may be solved utilizing the gate driver system described below.

FIG. 1 depicts an exemplary system infrastructure for a vehicle including a combined inverter and converter, according to one or more embodiments. In the context of this disclosure, the combined inverter and converter may be referred to as an inverter. As shown in FIG. 1, electric vehicle 100 may include an inverter 110, a motor 190, and a battery 195. The inverter 110 may include components to receive electrical power from an external source and output electrical power to charge battery 195 of electric vehicle 100. The inverter 110 may convert DC power from battery 195 in electric vehicle 100 to AC power, to drive motor 190 of the electric vehicle 100, for example, but the embodiments are not limited thereto. The inverter 110 may be bidirectional, and may convert DC power to AC power, or convert AC power to DC power, such as during regenerative braking, for example. Inverter 110 may be a three-phase inverter, a single-phase inverter, or a multi-phase inverter.

Figure 2:
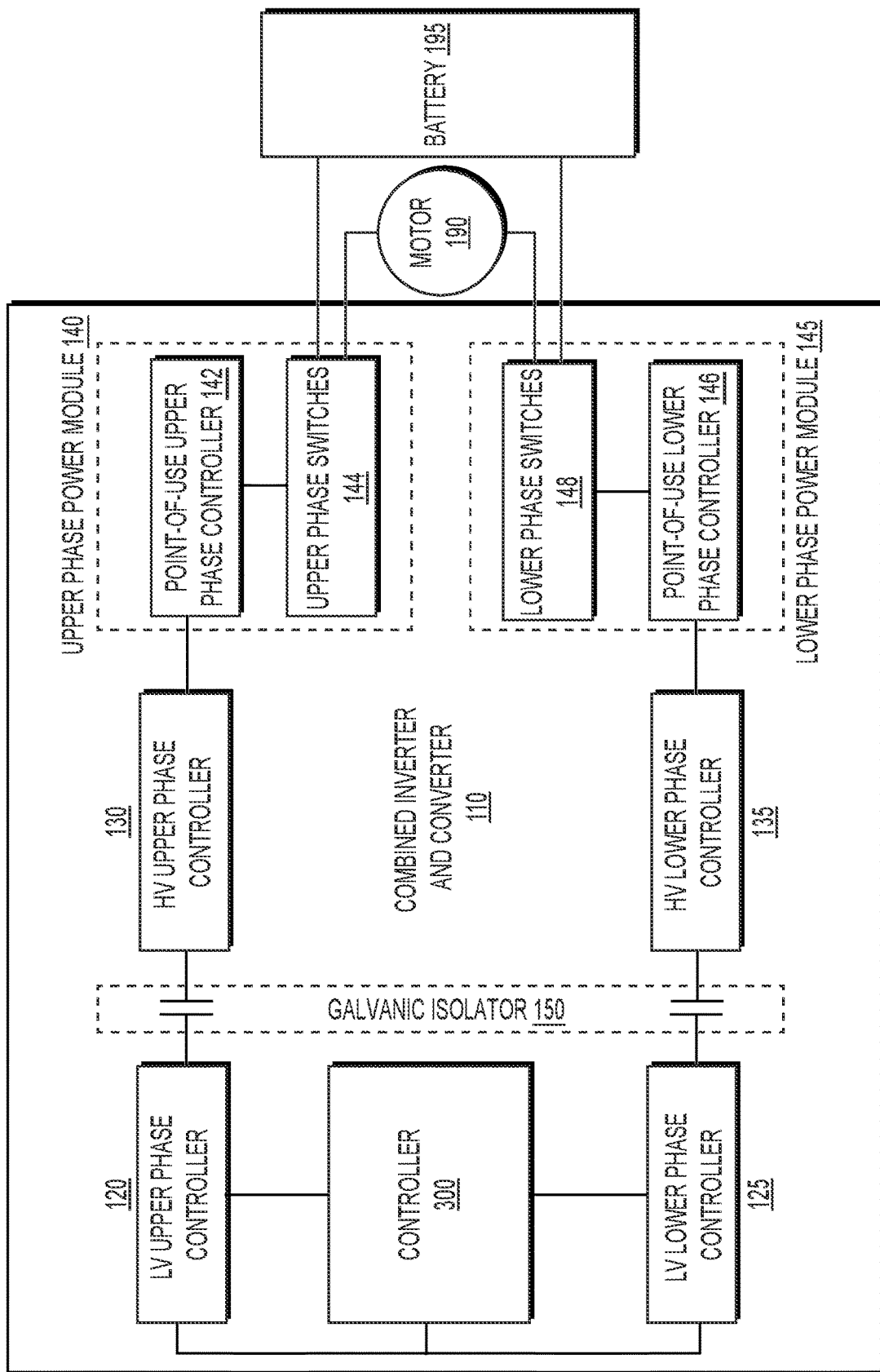
FIG. 2 depicts an exemplary system infrastructure for the combined inverter and converter of FIG. 1 with a point-of-use switch controller, according to one or more embodiments.

FIG. 2 depicts an exemplary system infrastructure for the inverter 110 of FIG. 1 with a point-of-use switch controller, according to one or more embodiments. Electric vehicle 100 may include inverter 110, motor 190, and battery 195. Inverter 110 may include an inverter controller 300 (shown in FIG. 3) to control the inverter 110. Inverter 110 may include a low voltage upper phase controller 120 separated from a high voltage upper phase controller 130 by a galvanic isolator 150, and an upper phase power module 140. Upper phase power module 140 may include a point-of-use upper phase controller 142 and upper phase switches 144. Inverter 110 may include a low voltage lower phase controller 125 separated from a high voltage lower phase controller 135 by galvanic isolator 150, and a lower phase power module 145. Lower phase power module 145 may include a point-of-use lower phase controller 146 and lower phase switches 148. Upper phase switches 144 and lower phase switches 148 may be connected to motor 190 and battery 195. Galvanic isolator 150 may be one or more of optical, transformer-based, or capacitance-based isolation. Galvanic isolator 150 may be one or more capacitors with a value from approximately 20 fF to approximately 100 fF, with a breakdown voltage from approximately 6 kV to approximately 12 kV, for example. Galvanic isolator 150 may include a pair of capacitors, where one capacitor of the pair carries an inverse data signal from the other capacitor of the pair to create a differential signal for common-mode noise rejection. Galvanic isolator 150 may include more than one capacitor in series. Galvanic isolator 150 may include one capacitor located on a first IC, or may include a first capacitor located on a first IC and a second capacitor located on a second IC that communicates with the first IC.

Inverter 110 may include a low voltage area, where voltages are generally less than 5V, for example, and a high voltage area, where voltages may exceed 500V, for example. The low voltage area may be separated from the high voltage area by galvanic isolator 150. Inverter controller 300 may be in the low voltage area of inverter 110, and may send signals to and receive signals from low voltage upper phase controller 120. Low voltage upper phase controller 120 may be in the low voltage area of inverter 110, and may send signals to and receive signals from high voltage upper phase controller 130. Low voltage upper phase controller 120 may send signals to and receive signals from low voltage lower phase controller 125. High voltage upper phase controller 130 may be in the high voltage area of inverter 110. Accordingly, signals between low voltage upper phase controller 120 and high voltage upper phase controller 130 pass through galvanic isolator 150. High voltage upper phase controller 130 may send signals to and receive signals from point-of-use upper phase controller 142 in upper phase power module 140. Point-of-use upper phase controller 142 may send signals to and receive signals from upper phase switches 144. Upper phase switches 144 may be connected to motor 190 and battery 195. Upper phase switches 144 and lower phase switches 148 may be used to transfer energy from motor 190 to battery 195, from battery 195 to motor 190, from an external source to battery 195, or from battery 195 to an external source, for example. The lower phase system of inverter 110 may be similar to the upper phase system as described above.

Figure 3:
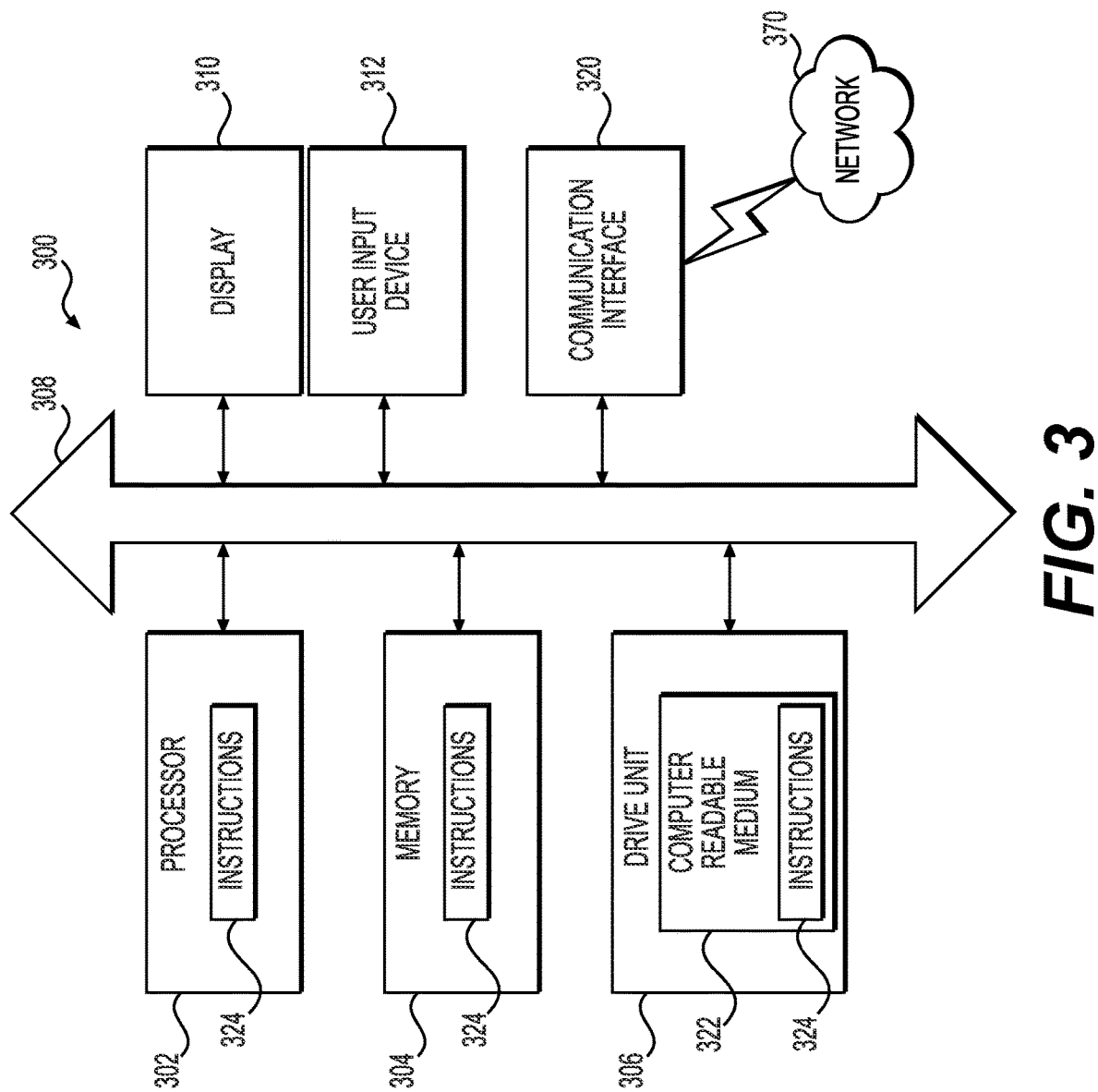
FIG. 3 depicts an exemplary system infrastructure for the controller of FIG. 2, according to one or more embodiments.

FIG. 3 depicts an exemplary system infrastructure for inverter controller 300 of FIG. 2, according to one or more embodiments. Inverter controller 300 may include one or more controllers.

The inverter controller 300 may include a set of instructions that can be executed to cause the inverter controller 300 to perform any one or more of the methods or computer based functions disclosed herein. The inverter controller 300 may operate as a standalone device or may be connected, e.g., using a network, to other computer systems or peripheral devices.

In a networked deployment, the inverter controller 300 may operate in the capacity of a server or as a client in a server-client user network environment, or as a peer computer system in a peer-to-peer (or distributed) network environment. The inverter controller 300 can also be implemented as or incorporated into various devices, such as a personal computer (PC), a tablet PC, a set-top box (STB), a personal digital assistant (PDA), a mobile device, a palmtop computer, a laptop computer, a desktop computer, a communications device, a wireless telephone, a land-line telephone, a control system, a camera, a scanner, a facsimile machine, a printer, a pager, a personal trusted device, a web appliance, a network router, switch or bridge, or any other machine capable of executing a set of instructions (sequential or otherwise) that specify actions to be taken by that machine. In a particular implementation, the inverter controller 300 can be implemented using electronic devices that provide voice, video, or data communication. Further, while the inverter controller 300 is illustrated as a single system, the term "system" shall also be taken to include any collection of systems or sub-systems that individually or jointly execute a set, or multiple sets, of instructions to perform one or more computer functions.

As shown in FIG. 3, the inverter controller 300 may include a processor 302, e.g., a central processing unit (CPU), a graphics processing unit (GPU), or both. The processor 302 may be a component in a variety of systems. For example, the processor 302 may be part of a standard inverter. The processor 302 may be one or more general processors, digital signal processors, application specific integrated circuits, field programmable gate arrays, servers, networks, digital circuits, analog circuits, combinations thereof, or other now known or later developed devices for analyzing and processing data. The processor 302 may implement a software program, such as code generated manually (i.e., programmed).

The inverter controller 300 may include a memory 304 that can communicate via a bus 308. The memory 304 may be a main memory, a static memory, or a dynamic memory. The memory 304 may include, but is not limited to computer readable storage media such as various types of volatile and non-volatile storage media, including but not limited to random access memory, read-only memory, programmable read-only memory, electrically programmable read-only memory, electrically erasable read-only memory, flash memory, magnetic tape or disk, optical media and the like. In one implementation, the memory 304 includes a cache or random-access memory for the processor 302. In alternative implementations, the memory 304 is separate from the processor 302, such as a cache memory of a processor, the system memory, or other memory. The memory 304 may be an external storage device or database for storing data. Examples include a hard drive, compact disc ("CD"), digital video disc ("DVD"), memory card, memory stick, floppy disc, universal serial bus ("USB") memory device, or any other device operative to store data. The memory 304 is operable to store instructions executable by the processor 302. The functions, acts or tasks illustrated in the figures or described herein may be performed by the processor 302 executing the instructions stored in the memory 304. The functions, acts or tasks are independent of the particular type of instructions set, storage media, processor or processing strategy and may be performed by software, hardware, integrated circuits, firm-ware, micro-code and the like, operating alone or in combination. Likewise, processing strategies may include multiprocessing, multitasking, parallel processing and the like.

As shown, the inverter controller 300 may further include a display 310, such as a liquid crystal display (LCD), an organic light emitting diode (OLED), a flat panel display, a solid-state display, a cathode ray tube (CRT), a projector, a printer or other now known or later developed display device for outputting determined information. The display 310 may act as an interface for the user to see the functioning of the processor 302, or specifically as an interface with the software stored in the memory 304 or in the drive unit 306.

Additionally or alternatively, the inverter controller 300 may include an input device 312 configured to allow a user to interact with any of the components of inverter controller 300. The input device 312 may be a number pad, a keyboard, or a cursor control device, such as a mouse, or a joystick, touch screen display, remote control, or any other device operative to interact with the inverter controller 300.

The inverter controller 300 may also or alternatively include drive unit 306 implemented as a disk or optical drive. The drive unit 306 may include a computer-readable medium 322 in which one or more sets of instructions 324, e.g. software, can be embedded. Further, the instructions 324 may embody one or more of the methods or logic as described herein. The instructions 324 may reside completely or partially within the memory 304 and/or within the processor 302 during execution by the inverter controller 300. The memory 304 and the processor 302 also may include computer-readable media as discussed above.

In some systems, a computer-readable medium 322 includes instructions 324 or receives and executes instructions 324 responsive to a propagated signal so that a device connected to a network 370 can communicate voice, video, audio, images, or any other data over the network 370. Further, the instructions 324 may be transmitted or received over the network 370 via a communication port or interface 320, and/or using a bus 308. The communication port or interface 320 may be a part of the processor 302 or may be a separate component. The communication port or interface 320 may be created in software or may be a physical connection in hardware. The communication port or interface 320 may be configured to connect with a network 370, external media, the display 310, or any other components in inverter controller 300, or combinations thereof. The connection with the network 370 may be a physical connection, such as a wired Ethernet connection or may be established wirelessly as discussed below. Likewise, the additional connections with other components of the inverter controller 300 may be physical connections or may be established wirelessly. The network 370 may alternatively be directly connected to a bus 308.

While the computer-readable medium 322 is shown to be a single medium, the term "computer-readable medium" may include a single medium or multiple media, such as a centralized or distributed database, and/or associated caches and servers that store one or more sets of instructions. The term "computer-readable medium" may also include any medium that is capable of storing, encoding, or carrying a set of instructions for execution by a processor or that cause a computer system to perform any one or more of the methods or operations disclosed herein. The computer-readable medium 322 may be non-transitory, and may be tangible.

The computer-readable medium 322 can include a solid-state memory such as a memory card or other package that houses one or more non-volatile read-only memories. The computer-readable medium 322 can be a random-access memory or other volatile re-writable memory. Additionally or alternatively, the computer-readable medium 322 can include a magneto-optical or optical medium, such as a disk or tapes or other storage device to capture carrier wave signals such as a signal communicated over a transmission medium. A digital file attachment to an e-mail or other self-contained information archive or set of archives may be considered a distribution medium that is a tangible storage medium. Accordingly, the disclosure is considered to include any one or more of a computer-readable medium or a distribution medium and other equivalents and successor media, in which data or instructions may be stored.

In an alternative implementation, dedicated hardware implementations, such as application specific integrated circuits, programmable logic arrays and other hardware devices, can be constructed to implement one or more of the methods described herein. Applications that may include the apparatus and systems of various implementations can broadly include a variety of electronic and computer systems. One or more implementations described herein may implement functions using two or more specific interconnected hardware modules or devices with related control and data signals that can be communicated between and through the modules, or as portions of an application-specific integrated circuit. Accordingly, the present system encompasses software, firmware, and hardware implementations.

The inverter controller 300 may be connected to a network 370. The network 370 may define one or more networks including wired or wireless networks. The wireless network may be a cellular telephone network, an 802.11, 802.16, 802.20, or WiMAX network. Further, such networks may include a public network, such as the Internet, a private network, such as an intranet, or combinations thereof, and may utilize a variety of networking protocols now available or later developed including, but not limited to TCP/IP based networking protocols. The network 370 may include wide area networks (WAN), such as the Internet, local area networks (LAN), campus area networks, metropolitan area networks, a direct connection such as through a Universal Serial Bus (USB) port, or any other networks that may allow for data communication. The network 370 may be configured to couple one computing device to another computing device to enable communication of data between the devices. The network 370 may generally be enabled to employ any form of machine-readable media for communicating information from one device to another. The network 370 may include communication methods by which information may travel between computing devices. The network 370 may be divided into sub-networks. The sub-networks may allow access to all of the other components connected thereto or the sub-networks may restrict access between the components. The network 370 may be regarded as a public or private network connection and may include, for example, a virtual private network or an encryption or other security mechanism employed over the public Internet, or the like.

In accordance with various implementations of the present disclosure, the methods described herein may be implemented by software programs executable by a computer system. Further, in an exemplary, non-limited implementation, implementations can include distributed processing, component or object distributed processing, and parallel processing. Alternatively, virtual computer system processing can be constructed to implement one or more of the methods or functionality as described herein.

Although the present specification describes components and functions that may be implemented in particular implementations with reference to particular standards and protocols, the disclosure is not limited to such standards and protocols. For example, standards for Internet and other packet switched network transmission (e.g., TCP/IP, UDP/IP, HTML, HTTP) represent examples of the state of the art. Such standards are periodically superseded by faster or more efficient equivalents having essentially the same functions. Accordingly, replacement standards and protocols having the same or similar functions as those disclosed herein are considered equivalents thereof.

It will be understood that the operations of methods discussed are performed in one embodiment by an appropriate processor (or processors) of a processing (i.e., computer) system executing instructions (computer-readable code) stored in storage. It will also be understood that the disclosure is not limited to any particular implementation or programming technique and that the disclosure may be implemented using any appropriate techniques for implementing the functionality described herein. The disclosure is not limited to any particular programming language or operating system.

Figure 4:
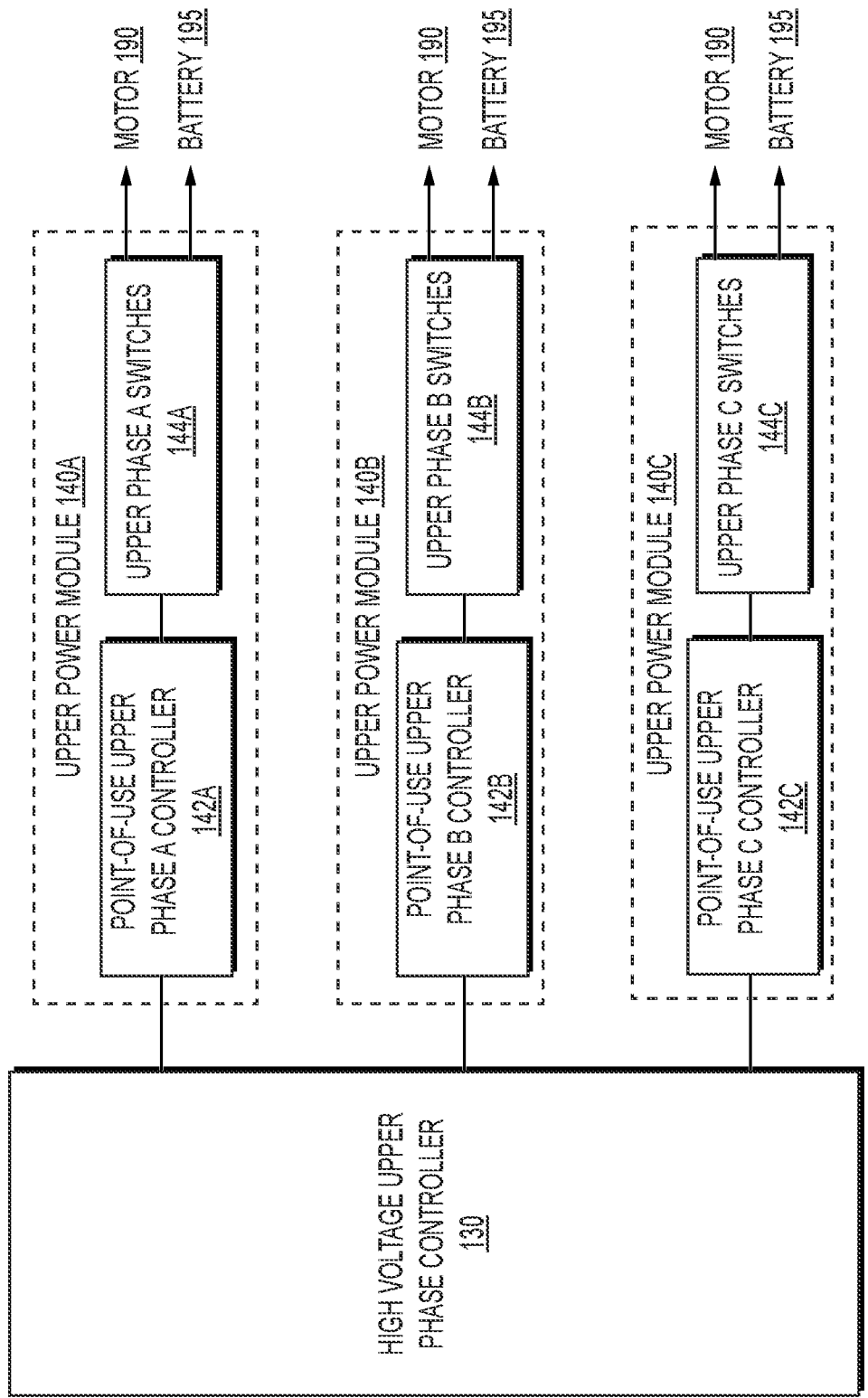
FIG. 4 depicts an exemplary system infrastructure for the point-of-use switch controller of FIG. 2, according to one or more embodiments.

FIG. 4 depicts an exemplary system infrastructure for the point-of-use switch controller of FIG. 2, according to one or more embodiments. For a three-phase inverter, each of the upper phase and the lower phase may include three phases correlating with phases A, B, and C. For example, upper phase power module 140 may include upper phase power module 140A for upper phase A, upper phase power module 140B for upper phase B, and upper phase power module 140C for upper phase C. Upper phase power module 140A may include point-of-use upper phase A controller 142A and upper phase A switches 144A. Upper phase power module 140B may include point-of-use upper phase B controller 142B and upper phase B switches 144B. Upper phase power module 140C may include point-of-use upper phase C controller 142C and upper phase C switches 144C. Each of the upper phase A switches 144A, upper phase B switches 144B, and upper phase C switches 144C may be connected to motor 190 and battery 195. FIG. 4 depicts details of the upper phase power module 140. Although not shown, the lower phase power module 145 may include a similar structure as the upper phase power module 140 for lower phases A, B, and C.

Figure 5:
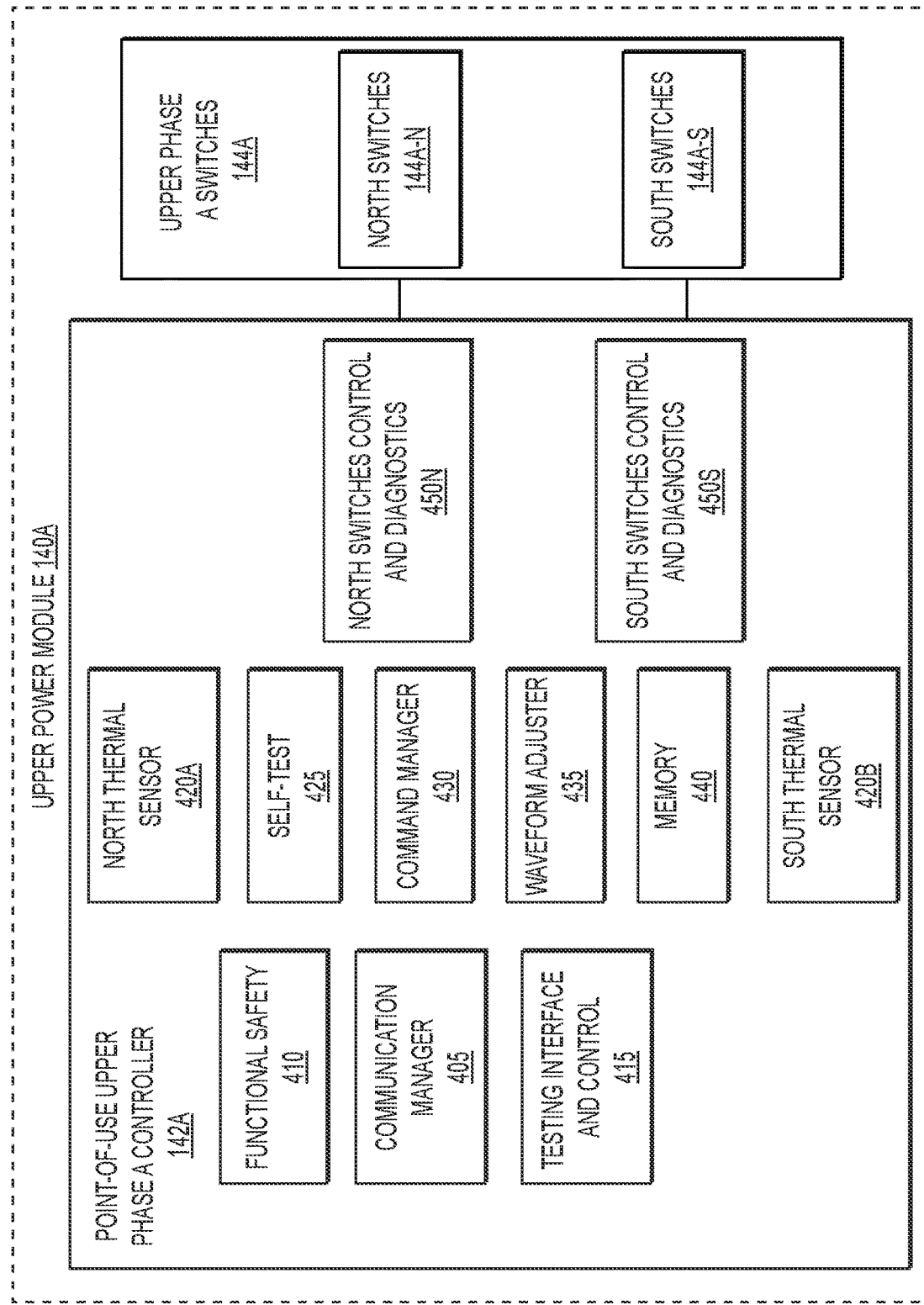
FIG. 5 depicts an exemplary system infrastructure for the upper power module of FIG. 4, according to one or more embodiments.

FIG. 5 depicts an exemplary system infrastructure for the upper power module of FIG. 4, according to one or more embodiments. For example, FIG. 5 provides additional details of upper phase power module 140A. Although not shown, upper phase power module 140B, upper phase power module 140C, and respective lower phase power modules of lower phase power module 145 may include a similar structure as the upper phase power module 140A shown in FIG. 5. Moreover, the terms upper, lower, north, and south used in the disclosure are merely for reference, do not limit the elements to a particular orientation, and are generally interchangeable throughout. For example, the upper phase power module 140 could be referred to a lower phase power module, a north phase power module, a south phase power module, a first phase power module, or a second phase power module.

Upper phase power module 140A may include point-of-use upper phase A controller 142A and upper phase A switches 144A. Upper phase A switches 144A may include one or more groups of switches. As shown in FIG. 5, upper phase A switches 144A may include upper phase A north switches 144A-N and upper phase A south switches 144A-S. Point-of-use upper phase A controller 142A may include one or more memories, controllers, or sensors. For example, point-of-use upper phase A controller 142A may include a communication manager 405, a functional safety controller 410, a testing interface and controller 415, a north thermal sensor 420A, a south thermal sensor 420B, a self-test controller 425, a command manager 430, a waveform adjuster 435, a memory 440, north switches control and diagnostics controller 450N, and south switches control and diagnostics controller 450S. Point-of-use upper phase A controller 142A may include more or less components than those shown in FIG. 5. For example, point-of-use upper phase A controller 142A may include more or less than two switch control and diagnostics controllers, and may include more than two thermal sensors.

Communication manager 405 may control inter-controller communications to and from point-of-use upper phase A controller 142A and/or may control intra-controller communications between components of point-of-use upper phase A controller 142A. Functional safety controller 410 may control safety functions of point-of-use upper phase A controller 142A. Testing interface and controller 415 may control testing functions of point-of-use upper phase A controller 142A, such as end-of-line testing in manufacturing, for example. North thermal sensor 420A may sense a temperature at a first location in point-of-use upper phase A controller 142A, and south thermal sensor 420B may sense a temperature at a second location in point-of-use upper phase A controller 142A. Self-test controller 425 may control a self-test function of point-of-use upper phase A controller 142A, such as during an initialization of the point-of-use upper phase A controller 142A following a power on event of inverter 110, for example. Command manager 430 may control commands received from communication manager 405 issued to the north switches control and diagnostics controller 450N and south switches control and diagnostics controller 450S. Waveform adjuster 435 may control a waveform timing and shape of commands received from communication manager 405 issued to the north switches control and diagnostics controller 450N and south switches control and diagnostics controller 450S. Memory 440 may include one or more volatile and non-volatile storage media for operation of point-of-use upper phase A controller 142A. North switches control and diagnostics controller 450N may send one or more signals to north switches 144A-N to control an operation of north switches 144A-N, and may receive one or more signals from north switches 144A-N that provide information about north switches 144A-N. South switches control and diagnostics controller 450S may send one or more signals to south switches 144A-S to control an operation of south switches 144A-S, and may receive one or more signals from south switches 144A-S that provide information about south switches 144A-S. As stated above, the terms north and south are merely used for reference, and north switches control and diagnostics controller 450N may send one or more signals to south switches 144A-S, and south switches control and diagnostics controller 450S may send one or more signals to south switches 144A-N.

Figure 6:
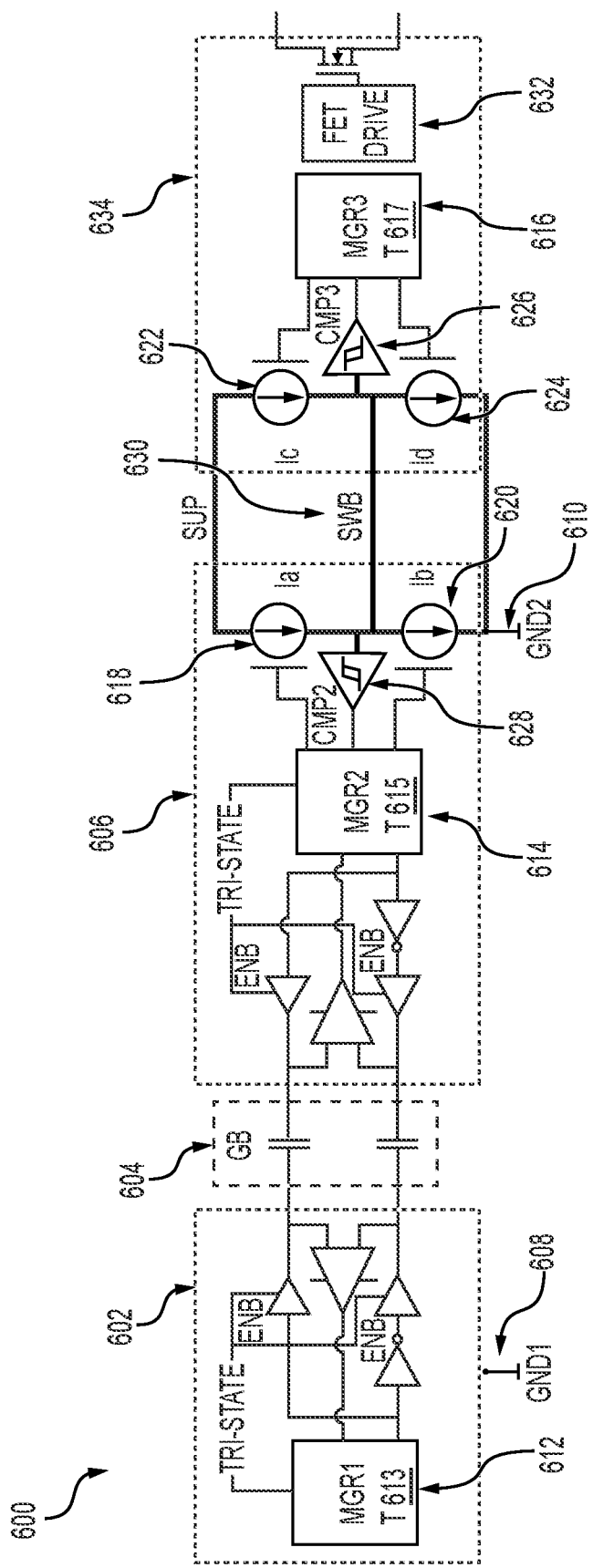
FIG. 6 depicts an exemplary electrical schematic for a bidirectional communication architecture, according to one or more embodiments.

FIG. 6 depicts an exemplary electrical schematic for a bidirectional communication architecture, according to one or more embodiments. The bidirectional communication architecture may include one or more integrated circuits or other electronic circuits. As shown in FIG. 6, a gate driver 600 of inverter 110 may include two ground (GND) planes denoted as GND1 608 and GND2 610, which may be separated by a galvanic interface 604. GND1 608 may be the low voltage plane of inverter 110 and GND2 610 may be the high voltage plane of inverter 110, and galvanic interface 604 may be an implementation of galvanic isolator 150. GND1 608 and GND2 610 may communicate by modulating a stream of pulses in either direction across the galvanic interface 604 using galvanic transceivers that may be controlled by logic managers, referred to as MGR1 612 and MGR2 614, respectively. MGR1 612 and MGR2 614 may include additional components as shown by MGR1 module 602 and MGR2 module 606, and may be implementations of low voltage upper phase controller 120 and high voltage upper phase controller 130. This communication may be depicted in FIG. 7 as discussed further below. Within the message encoding scheme for the galvanic interface, a period with transmitted pulses may be defined as a dominant phase and a period with no transmitted pulses may be defined as a recessive phase. MGR1 612 and MGR2 614 may further include timer (T) 613 and timer (T) 615, respectively, that may measure the time over which communication over the galvanic interface 604 is measured as dominant or recessive. The measured times may be used to delineate data bits. For example, the stream of pulses may be approximately 50% duty cycle square waves with periods from approximately 10 nS to approximately 100 nS. For example, the pulses may be continuously provided as on or off to send data to command a FET on or off, respectively. For example, the pulses may be modulated into a logic 0 bit and a logic 1 bit, where a logic 0 bit ranges from approximately 250 nS to approximately 2 µS, and a logic 1 bit ranges from approximately 500 nS to approximately 4 µS.

The gate driver 600 may include a message encoding scheme for a galvanic interface, where a logic 0 bit is defined as a dominant phase for a first period of time followed by a recessive phase for a second period of time, and a logic 1 bit is defined as a dominant phase for the first period of time followed by a recessive phase for a third period of time that is longer than the second period of time for the recessive phase for the logic 0 bit. For example, for a logic 0 bit, a dominant phase may include a dominant phase of approximately 500 nS, followed by a recessive phase of approximately 1 µS. For example, for a logic 1 bit, a dominant phase may include a dominant phase of approximately 500 nS, followed by a recessive phase of approximately 2 µS. In this example, the recessive phase of approximately 2 µS for the logic 1 bit is longer than the recessive phase of approximately 1 µS for the logic 0 bit.

MGR1 612 and MGR2 614 may include logic rules whereby galvanic transmitters may be placed into tri-state during the recessive phase, between the dominant phase and when communication over the galvanic interface 604 is unused, so that pulses travelling in the opposite direction may be detected by MGR1 612 and MGR2 614. Further, MGR1 612 and MGR2 614 may include logic rules such that the detection of pulses, during the recessive phases of data bits, is interpreted as an interrupt from the opposing MGR, resulting in the interrupted party yielding communication over the galvanic interface 604 to the interrupter (e.g., the respective MGR, MGR1 612 or MGR2 614). Tri-state refers to a transmitter that no longer drives two signal lines to the galvanic interface 604. Both transmitters (e.g. MGR1 612 or MGR2 614) may be in tri-state on both sides of the galvanic interface 604.

In tri-state, either transmitter may start sending data while the other side is available to listen. Both transmitters may simultaneously be in tri-state and then simultaneously start sending data. Here, neither receiver will see the data because both are sending data, and a transceiver cannot both send and receive data at the same time. One or more embodiments may describe a message protocol to ensure that this collision does not continue. One of the transmitters (e.g. MGR1 612 or MGR2 614) may start communicating using an interrupt bit that has a very long dominant phase (such as approximately 3 µS, for example). The other transmitter may start a message with a normal logic 0 bit or logic 1 bit, which has a shorter dominant phase (such as approximately 500 nS, for example). Either of the transmitters (e.g. MGR1 612 or MGR2 614) may be configured to begin a message with an interrupt and either may be configured to begin a message without an interrupt. However, both transmitters should not be configured to begin a message with an interrupt, and both transmitters should not configured to begin a message without an interrupt. One of the transmitters (e.g. MGR1 612 or MGR2 614) is configured to begin a message with an interrupt and the other is configured to begin a message without an interrupt. This configuration addresses the collision issue described above, because the transmitter that starts a message without the interrupt will turn off the pulses approximately 500 nS, for example, and will enter a recessive phase where no pulses are sent as a trailing phase of either the first logic 0 bit or logic 1 bit. At that point, the non-interrupt transmitter will see that the other (interrupt) transmitter is sending pulses and will concede the communication bus to the interrupt transmitter.

The gate driver 600 may include a single-wire data bus 630. The single-wire data bus 630 may be bidirectional, and may operate in GND2 610 plane that connects MGR2 614 to a point-of-use IC which may be placed in, on, or near the FET Drive 632, and which has a logic manager MGR3 616. MGR3 616 and FET Drive 632 may include additional components as shown by MGR3 module 634, and may be an implementation of communication manager 405 and north switches control and diagnostics controller 450N of point-of-use upper phase controller 142 for upper phase switches 144, for example. Gate driver 600 may include switched current sources and sinks (Ia 618, Ib 620, Ic 622, and Id 624) on both sides of the single-wire data bus 630, which may drive the single-wire data bus 630 to a high supply rail (SUP) or to a low supply rail (GND2 610). The gate driver 600 may further include a first comparator CMP2 628 located on a first side of the single-wire data bus 630 and a second comparator CMP3 626 located on a second side of the single-wire data bus 630. CMP2 628 and CMP3 626 may differentiate the high or low state of the single-wire data bus 630, where a low (or high) state is defined as dominant, and the opposing state is defined as recessive.

Further, timer (T) 615 and timer (T) 617 within MGR2 614 and MGR3 616, respectively, may measure the time over which the single-wire data bus 630 is measured as dominant or recessive and where the measured times are used to delineate data bits. Between MGR2 614 and MGR3 616 may be a message encoding scheme for the single-wire data bus 630 where a logic 0 bit is defined as a dominant phase for a first period of time followed by a recessive phase for a second period of time, and a logic 1 bit is defined as a dominant phase for the first period of time followed by a recessive phase for a third period of time that is longer than the second period of time for the recessive phase for the logic 0 bit.

The current sources and sinks (i.e., Ia 618, Ib 620, Ic 622, and Id 624) may provide a current greater than the highest possible EM field-induced coupled current that the single-wire data bus 630 could receive, in order to maintain the driven dominant or recessive state. Ia 618, Ib 620, Ic 622, and Id 624 sizing may be such that the assertion of a dominant state will always overdrive the assertion of a recessive state, such that a transmitter on either side of the single-wire data bus 630 can interrupt the recessive phase of a data bit by pulling the single-wire data bus 630 to a dominant state. For example, an operation of Ia 618 or Ic 622 may overdrive a state of the single-wire data bus 630 over an operation of Ib 620 or Id 624, or an operation of Ib 620 or Id 624 may overdrive a state of the single-wire data bus 630 over an operation of Ia 618 or Ic 622. Further, MGR2 614 and MGR3 616 may include logic rules such that an interrupt on the single-wire data bus 630 causes the interrupted party to yield the single-wire data bus 630 to the interrupter (e.g., the respective MGR).

Figure 9:
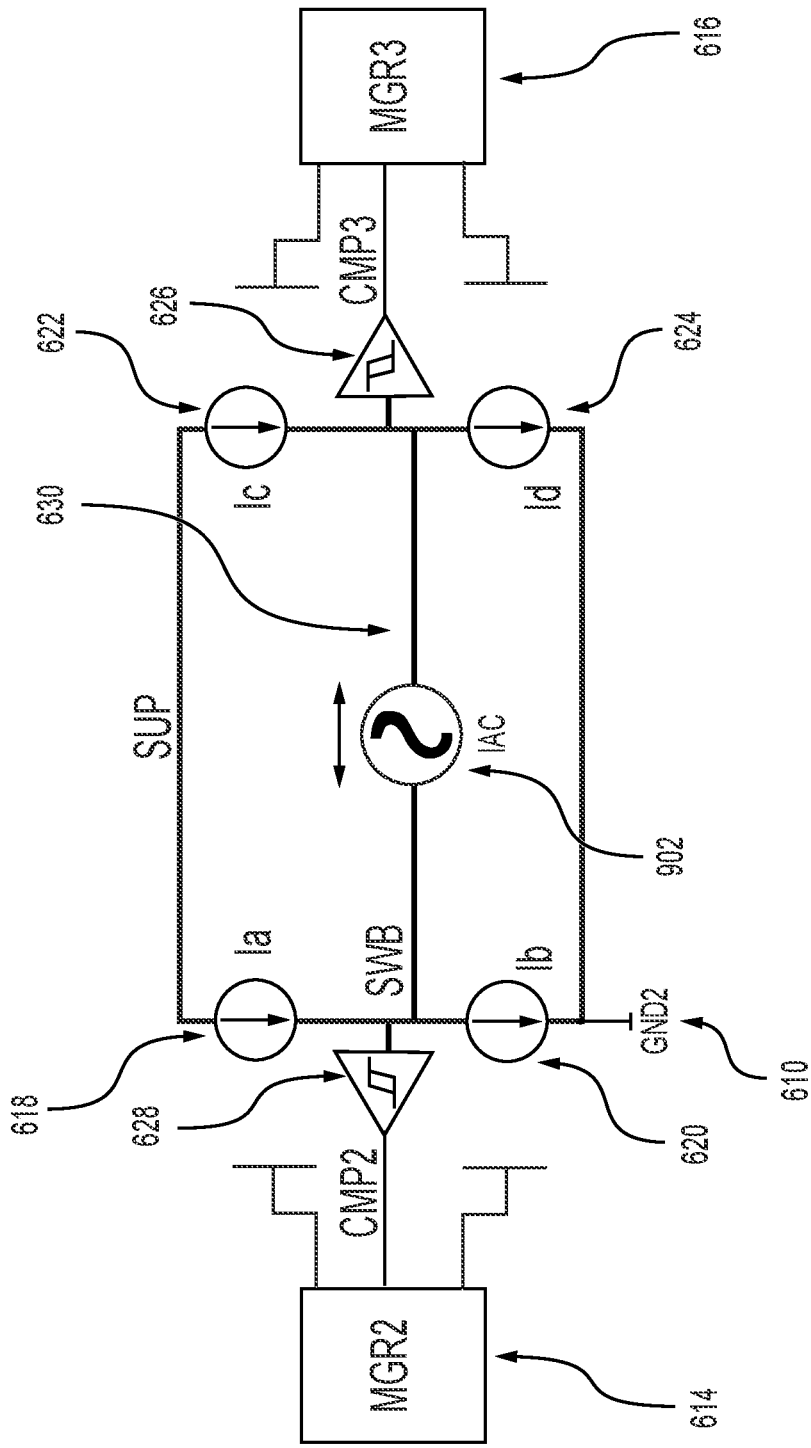
FIG. 9 depicts an exemplary electrical schematic for a bidirectional communication architecture, according to one or more embodiments.

FIG. 9 depicts an exemplary electrical schematic for a bidirectional communication architecture, according to one or more embodiments. FIG. 9 depicts a section of the gate driver 600 specifically including MGR2 614, single-wire data bus 630, and MGR3 616. FIG. 9 depicts the gate driver 600 with coupled current (Iac 902) on the single-wire data bus 630. As described herein, the current sources and sinks, Ia 618, Ib 620, Ic 622, and Id 624, may have a higher current capability than the worst case externally coupled current (Iac 902) such that the recessive or dominant state of the single-wire data bus 630 may be maintained in the desired state in the presence of the Iac.

As shown in FIG. 6, the gate driver 600 may include a bidirectional galvanic interface between two voltage planes. The gate driver 600 may include: (1) MGR1 612 and MGR2 614 that may manage sending and receiving galvanic pulses; (2) MGR2 614 and MGR3 616 that may manage sending and receiving data on a single-wire data bus 630; (3) the current sources and sinks (Ia 618, Ib 620, Ic 622, and Id 624); and (4) the message architecture for communication between MGR1 612 and MGR2 614, and between MGR2 614 and MGR3 616.

Figure 7:
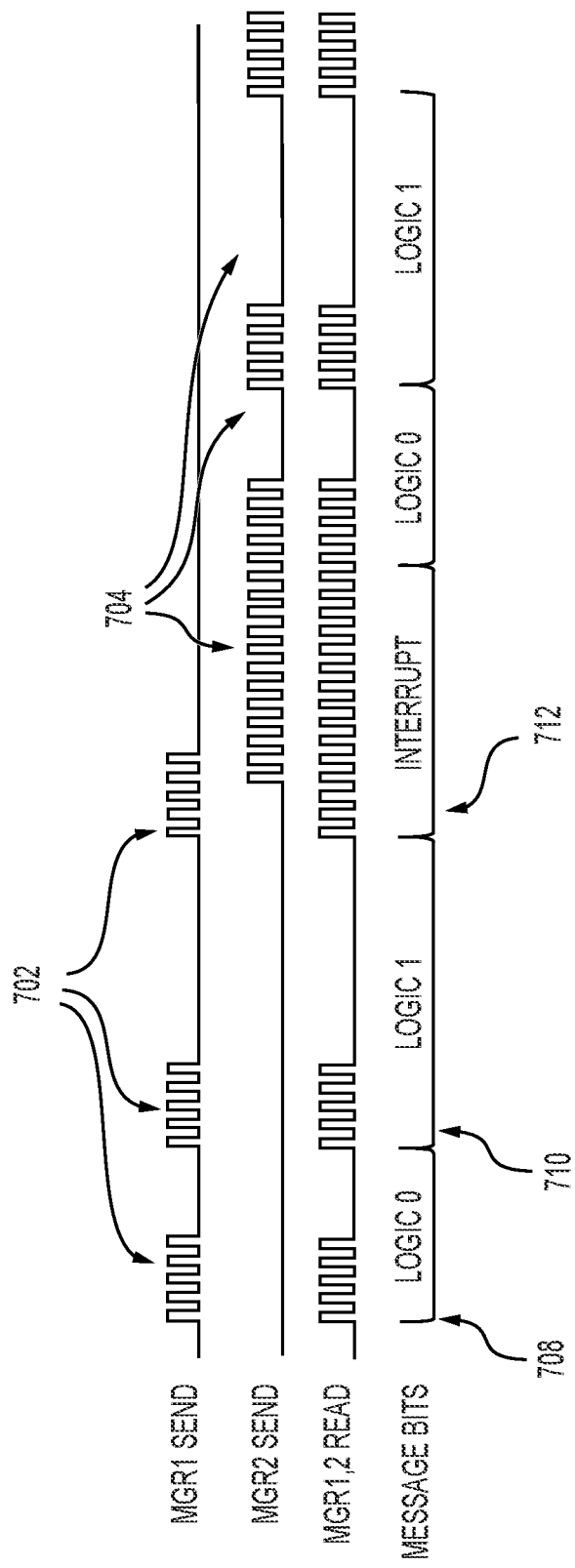
FIG. 7 depicts an exemplary message protocol between logic managers in an electrical circuit, according to one or more embodiments.

FIG. 7 depicts an exemplary message protocol between logic managers in an electrical circuit, according to one or more embodiments. For example, FIG. 7 illustrates an example communication between MGR1 612 and MGR2 614 with an interrupt.

As shown in FIG. 7, transmission of pulses 702 may occur in a dominant phase of the bit transmission. In the example transmission at 708, MGR1 612 is transmitting a logic 0 and MGR2 614 is receiving the logic 0. After the dominant phase of transmission of the logic 0, the transmission of logic 0 may include a recessive phase, where no pulse is transmitted by either MGR1 612 or MGR2 614. As shown in FIG. 7, a logic 0 at 708 may be transmitted with a short dominant phase followed by a short recessive phase, and a logic 1 at 710 may be transmitted with a short dominant phase followed by a long recessive phase. Either MGR1 612 or MGR2 614 can interrupt a sender by transmitting pulses during the sender's recessive bit phase, as shown by interrupt at 712, where MGR2 614 transmits pulses 704 to interrupt transmission of pulses 702 by MGR1 612. Here, MGR1 612 interprets the detection of pulses 704 from MGR2 614 during the recessive bit phase as an interrupt, and yields the communication over the galvanic interface 604 to the interrupter MGR2 614. Following the interrupt at 712, MGR2 614 transmits a logic 0 followed by a logic 1 to MGR1 612. As shown in FIG. 7, in the recessive phase of each bit transmission, both MGR1 612 and MGR2 614 are listening for an interrupt signal from the other MGR. Accordingly, a high priority message may interrupt a lower priority message in a very short amount of time. Here, the interrupt occurs within a single bit transmission.

Figure 8:
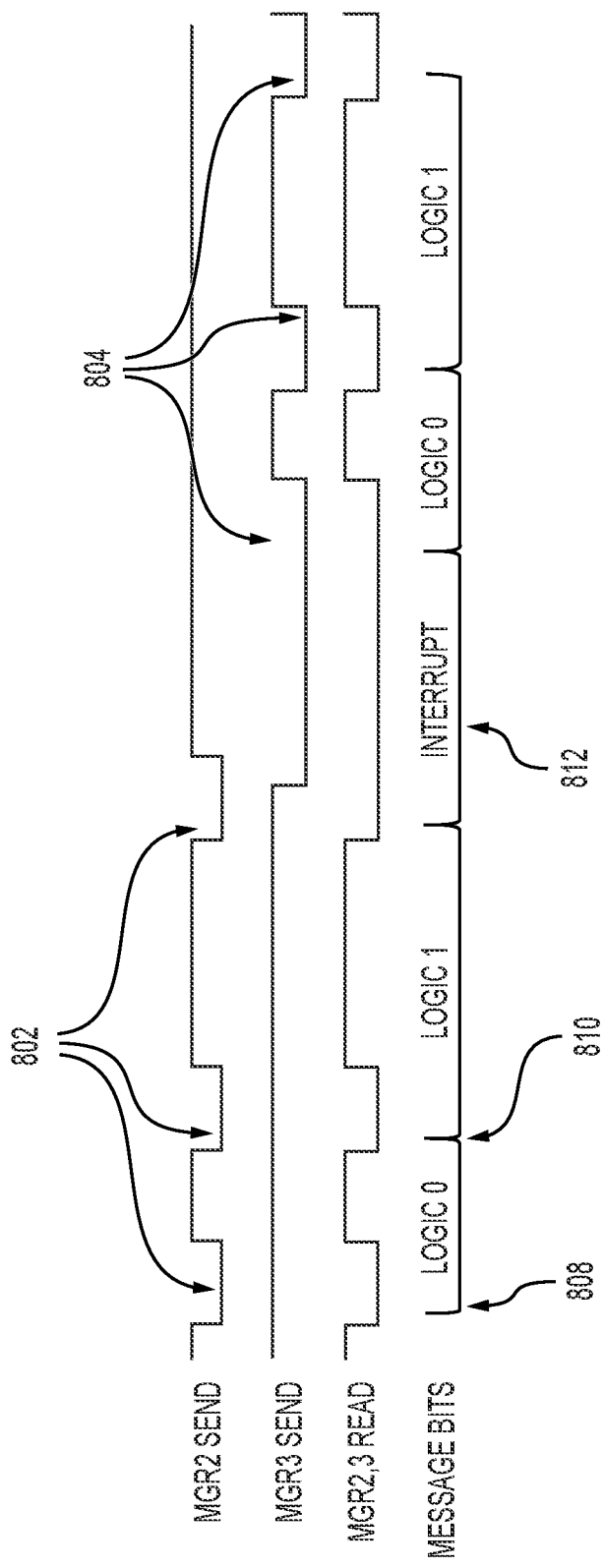
FIG. 8 depicts an exemplary message protocol between logic managers in an electrical circuit, according to one or more embodiments.

FIG. 8 depicts an exemplary message protocol between logic managers in an electrical circuit, according to one or more embodiments. For example, FIG. 8 illustrates an example communication between MGR2 614 and MGR3 616 with an interrupt.

Within the communication, a low state (e.g. 802) may indicate a dominant phase implemented by a sender's current sink (either Ib 620 for MGR2 614, or Id 624 for MGR3 616) being active. A high state may indicate a recessive phase implemented by a sender's current source (either Ia 618 for MGR2 614, or Ic 622 for MGR3 616). Similar to the communication of FIG. 7, transmission of a logic 0 at 808 may correspond to a short dominant phase followed by a short recessive phase, and transmission of a logic 1 at 810 may correspond to a short dominant phase followed by a long recessive phase. MGR2 614 and MGR3 616 may both interrupt a sender by activating a pull-down of single-wire data bus 630 to GND2 610 with a respective current sink (either Ib 620 for MGR2 614, or Id 624 for MGR3 616) while the sender is pulling up single-wire data bus 630 to SUP with a respective current source (either Ia 618 for MGR2 614, or Ic 622 for MGR3 616) during the recessive bit phase. The current sinks (either Ib 620 or Id 624) may have a higher current flow than the current sources (either Ia 618 or Ic 622), and therefore may overdrive the state of the single-wire data bus 630 as driven by the current sources (either Ia 618 or Ic 622). The sender may interpret the detection of a dominant phase during the recessive bit phase as an interrupt and yield the single-wire data bus 630 to the interrupter. Either MGR2 614 or MGR3 616 can interrupt a sender by activating a pull-down of single-wire data bus 630 to GND2 610 with a respective current sink during the sender's recessive bit phase, as shown by interrupt at 812, where MGR3 616 activates a pull-down of single-wire data bus 630 at 804 to interrupt a transmission 802 by MGR2 614. Here, MGR2 614 interprets the pull-down from MGR3 616 during the recessive bit phase as an interrupt, and yields the single-wire data bus 630 to the interrupter MGR3 616. Following the interrupt at 812, MGR3 616 transmits a logic 0 followed by a logic 1 to MGR2 614. As shown in FIG. 8, in the recessive phase of each bit transmission, both MGR2 614 and MGR3 613 are listening for an interrupt signal from the other MGR. Accordingly, a high priority message may interrupt a lower priority message in a very short amount of time. Here, the interrupt occurs within a single bit transmission.

The message architecture may include fields such as SOF, ID, ADD, R, PAY, CRC, and EOF, for example. SOF may refer to a start of frame field indicating that a new message is starting. The SOF may also be an interrupt phase if the new message is interrupting an existing message. ID may refer to an identification field. The ID field may define which MGR is sent a message. For example, MGR1 612 may be send a message to either MGR2 614 or MGR3 616 utilizing a two bit ID field. Further, MGR2 614 and MGR3 616 may send messages to any other MGR. ADD may refer to an Address field that indicates which register address is being written to or being read from. R may refer to a Read (write) field, and may define if the message is being written to or is requesting a read from the ADD field. PAY may refer to a message payload field, and may be the data to be written to ADD. The PAY field may be equal to zero when the message is a read request. CRC may refer to a cyclic redundancy check field, and may be used by a receiver to check that a message has arrived intact. EOF may refer to an end of frame field, and may indicate that a message has ended. Both the SOF and EOF fields may be formed using different bit architectures of logic 0 or logic 1 by varying the dominant or recessive times.

The gate driver 600 may have a message architecture as illustrated in FIG. 7 and FIG. 8. However, the disclosure is not limited thereto. The gate driver 600 may use a galvanic interface 604 in series with a single-wire data bus 630 for communicating between a point-of-use IC and a reference GND1 plane. The communication protocol may use the same bit structure and same interrupt structure so that MGR1 612, MGR2 614, and MGR3 616 can seamlessly communicate with each other and interrupt each other using the same format.

MGR1 612 may formulate a message originating from the inverter controller 300 or from internal logic of MGR1 612. MGR1 612 may send the message via galvanic pulses to MGR2 614. MGR2 614 may convert "pulses" to a low state and convert "no pulses" to a high state, or vice versa. These states may then be sent onto the single-wire data bus 630 to MGR3 616. MGR2 614 may also read the message because the message may be intended for MGR2 614 and not for MGR3 616. MGR2 614 may not receive advance information indicating an intended recipient and may send all messages received via galvanic interface 604 to MGR3 616 and read all received messages.

MGR3 616 may similarly send messages via single-wire data bus 630 to MGR2 614. MGR2 614 may send the message via galvanic interface 604 to MGR1 613 and read the message as well. MGR2 614 may convert the single-wire data bus 630 low states into "pulses" and convert single-wire data bus 630 high states into "no pulses", or vice versa. MGR2 614 has information indicating which direction the message was received (e.g. either from MGR1 613 via galvanic interface 604 or from MGR3 616 via single-wire data bus 630) to prevent MGR2 614 from sending a message back to a message sender. MGR2 614 also has information indicating that MGR2 614 is sending a message, and checks the respective data bus to ensure the data bus is correctly driven without reading the outgoing message on the respective data bus as in incoming message.

Figure 10:
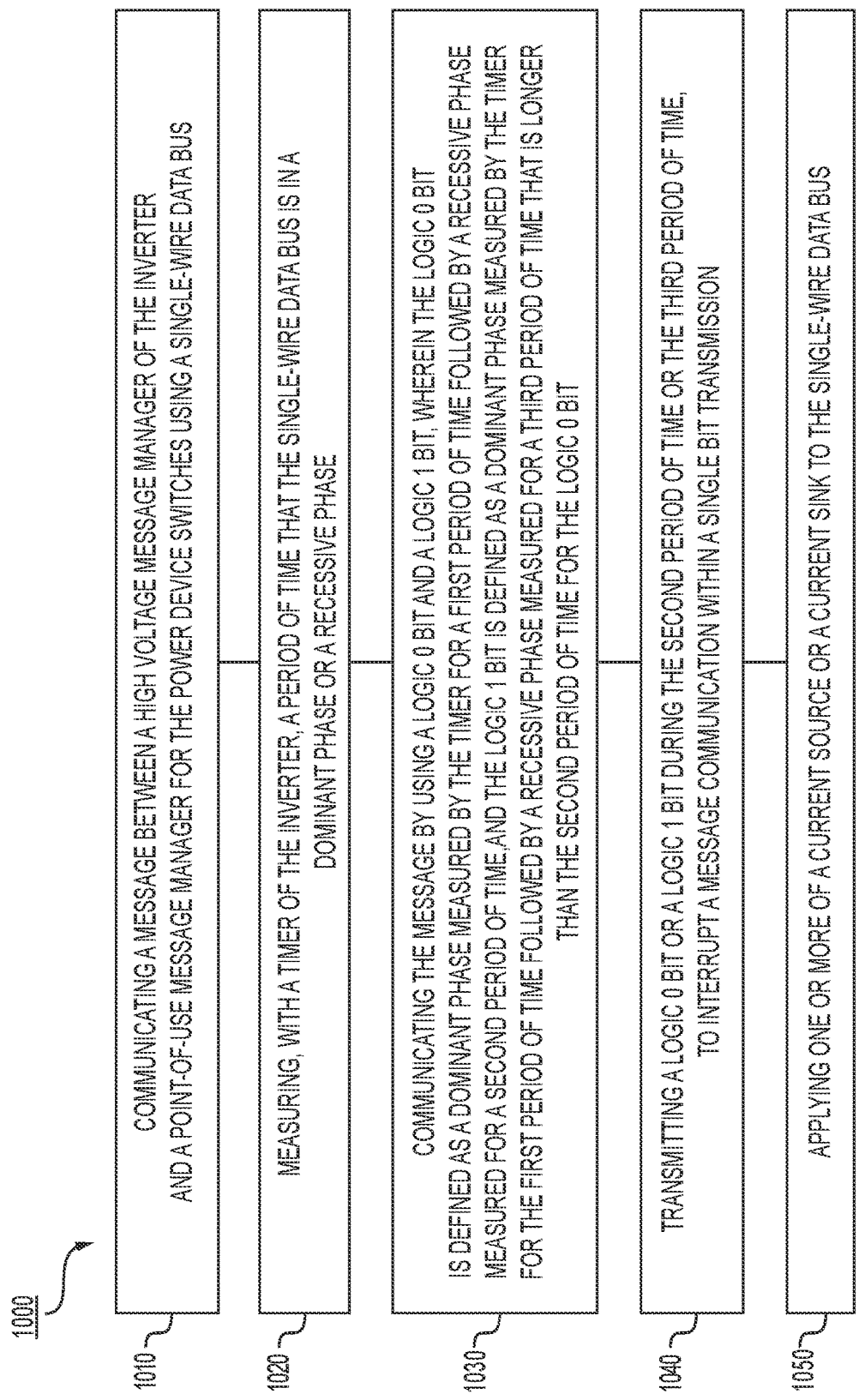
FIG. 10 depicts an exemplary method for message communication, according to one or more embodiments.

FIG. 10 depicts a method for message communication, according to one or more embodiments. A method 1000 for communicating with power device switches for an inverter 110 may include various operations. Method 1000 may include communicating a message between a high voltage message manager MGR1 612 of the inverter 110 and a point-of-use message manager MGR3 616 for the power device switches (e.g. upper phase switches 144) using a single-wire data bus 630 (operation 1010). Method 1000 may include measuring, with a timer 615 of the inverter 110, a period of time that the single-wire data bus 630 is in a dominant phase (e.g. with pulses 702) or a recessive phase (e.g. without pulses 702) (operation 1020). Method 1000 may include communicating the message using a logic 0 bit 808 and a logic 1 bit 810, wherein the logic 0 bit is defined as a dominant phase measured by the timer 615 for a first period of time followed by a recessive phase measured for a second period of time, and the logic 1 bit is defined as a dominant phase measured by the timer 615 for the first period of time followed by a recessive phase measured for a third period of time that is longer than the second period of time for the logic 0 bit (operation 1030). Method 1000 may include transmitting a logic 0 bit or a logic 1 bit during the second period of time or the third period of time, to interrupt (e.g. 812) a message communication within a single bit transmission (operation 1040). Method 1000 may include applying one or more of a current source (e.g. 618, 622) or a current sink (e.g. 620, 624) to the single-wire data bus 630 (operation 1050). The one or more of the current source or the current sink may have a higher current capability than an expected worst case externally coupled current. An expected worst case externally coupled current may be from approximately 100 mA to approximately 5 A, for example.

The system described herein may solve the problem of communication between a galvanically-isolated plane and a point-of-use IC by using a single-wire data bus 630, which is robust against worst-case induced current. The system described herein may allow the use of a point-of-use IC within a high EM field environment surrounding the FET. Point-of-use ICs may enable point-of-use control and feedback of FET operating conditions and fault response. Point-of-use control and response signals may be faster than control and response signals, which may be heavily filtered to reject coupled current before traveling between the FET and a galvanically isolated controller.

Signals that pass from the point-of-use IC to a remotely located gate driver must be filtered to reject the coupled currents and voltages. As stated above, the gate driver itself sends very high current signals to the FET to switch the FET on and off. These very high currents overdrive coupled currents, and thus, the gate driver can switch the FET on or off in less than approximately 100 nS, for example. However, signals coming from the FET are not driven by low impedance sources with many Amps of current. These signals are typically sensed voltage or currents that are at low levels, and therefore must be heavily filtered to reject high frequency coupled currents. This filtering slows down feedback from the FET to the gate driver and allows dangerous conditions to persist past the point where the gate driver could react to stop them. For example, over-current sensing for all SiC FETs is typically performed by sensing the FET Vdrain to Vsource differential voltage (Vds). The gate driver determines that the sensed Vds is greater than an acceptable threshold after the gate driver has commanded the FET to turn on. The gate driver will shut the FET off when the sensed Vds is too high. The sensed Vds must be filtered for approximately 2 µS to reject coupled currents. However, 2 µS is much too long to allow a SiC FET to remain in an over-current condition, which results in SiC FETs typically being damaged during an over-current event. The system described herein may provide a point-of-use IC that senses an over-current event in much less than 2 µS because the point-of-use IC is co-located with the FET and does not need to filter the data before reacting. The point-of-use IC will autonomously shut the FET off and will then report to the remote controller IC that the shutdown has occurred.

The system described herein may provide a common messaging architecture that works seamlessly across a galvanic interface 604 and a single-wire data bus 630. Messages sent from MGR1 612 across a galvanic interface 604 to MGR2 614 may simultaneously be read by MGR2 614 and passed across a single-wire data bus 630 to MGR3 616. The same data flow can be described for messages sent by MGR3 616 through MGR2 614 to MGR1 612. MGR2 614 can send messages simultaneously to MGR1 612 and MGR3 616. MGR1 612, MGR2 614, or MGR3 616 can interrupt incoming messages to gain control over the galvanic interface 604, the single-wire data bus 630, or both, in order to send a high priority message that may interrupt a low priority message.

Other embodiments of the disclosure will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A system comprising:
an inverter configured to convert DC power from a battery to AC power to drive a motor, wherein the inverter includes:
   a galvanic interface configured to separate a high voltage area from a low voltage area;
   a low voltage message manager in the low voltage area;
   a high voltage message manager in the high voltage area, and configured to communicate with the low voltage message manager; and
   a point-of-use message manager in the high voltage area, and configured to communicate with the high voltage message manager.

2. The system of claim 1, further comprising:
the battery configured to supply the DC power to the inverter; and
the motor configured to receive the AC power from the inverter to drive the motor.

3. The system of claim 1, wherein the point-of-use message manager is in a power module including one or more power device switches for the inverter, and
wherein the inverter further includes:
   a single-wire data bus connecting the high voltage message manager to the point-of-use message manager, wherein the point-of-use message manager is configured to communicate with the high voltage message manager using the single-wire data bus, and
   a timer configured to measure a period of time that the single-wire data bus is in a dominant phase or a recessive phase,
   wherein the low voltage message manager, the high voltage message manager, and the point-of-use message manager are configured to communicate using a logic 0 bit and a logic 1 bit, wherein
      the logic 0 bit is defined as a dominant phase measured by the timer for a first period of time followed by a recessive phase measured for a second period of time, and
      the logic 1 bit is defined as a dominant phase measured by the timer for the first period of time followed by a recessive phase measured for a third period of time that is longer than the second period of time for the logic 0 bit.

4. A system comprising:
a galvanic interface configured to separate a high voltage area from a low voltage area;
a low voltage message manager in the low voltage area;
a high voltage message manager in the high voltage area, and configured to communicate with the low voltage message manager; and
a point-of-use message manager in the high voltage area, and configured to communicate with the high voltage message manager.

5. The system of claim 4, further comprising:
a single-wire data bus connecting the high voltage message manager to the point-of-use message manager, wherein the point-of-use message manager is configured to communicate with the high voltage message manager using the single-wire data bus.

6. The system of claim 5, further comprising:
a first switched current source configured to operate with the high voltage message manager to drive the single-wire data bus to a power rail;

a second switched current source configured to operate with the point-of-use message manager to drive the single-wire data bus to the power rail;

a third switched current sink configured to operate with the high voltage message manager to drive the single-wire data bus to a ground rail; and a fourth switched current sink configured to operate with the point-of-use message manager to drive the single-wire data bus to the ground rail.

7. The system of claim 6, wherein one or more of the first switched current source or the second switched current source is configured to overdrive a state of the single-wire data bus as driven by an operation of the third switched current sink or the fourth switched current sink, or wherein one or more of the third switched current sink or the fourth switched current sink is configured to overdrive a state of the single-wire data bus as driven by an operation of the first switched current source or the second switched current source.

8. The system of claim 6, wherein the first switched current source, the second switched current source, the third switched current sink, and the fourth switched current sink have a higher current capability than an expected worst case externally coupled current.

9. The system of claim 6, further comprising:

a first comparator configured to operate with the high voltage message manager to differentiate a high state or a low state of the single-wire data bus; and a second comparator configured to operate with the point-of-use message manager to differentiate a high state or a low state of the single-wire data bus.

10. The system of claim 5, wherein one or more of the low voltage message manager, the high voltage message manager, or the point-of-use message manager includes a timer configured to measure a period of time that the single-wire data bus is in a dominant phase or a recessive phase.

11. The system of claim 10, wherein the low voltage message manager, the high voltage message manager, and the point-of-use message manager are configured to communicate using a logic 0 bit and a logic 1 bit, wherein the logic 0 bit is defined as a dominant phase measured by the timer for a first period of time followed by a recessive phase measured for a second period of time, and the logic 1 bit is defined as a dominant phase measured by the timer for the first period of time followed by a recessive phase measured for a third period of time that is longer than the second period of time for the logic 0 bit.

12. The system of claim 11, wherein an interrupting manager, among the low voltage message manager, the high voltage message manager, and the point-of-use message manager, is configured to interrupt a transmitting manager, among the low voltage message manager, the high voltage message manager, and the point-of-use message manager, by transmitting a logic 0 bit or a logic 1 bit during the second period of time or the third period of time, and the transmitting manager is configured to yield communication to the interrupting manager within a single bit transmission.

13. The system of claim 4, wherein the point-of-use message manager is in a power module including one or more power device switches for an inverter.

14. The system of claim 4, wherein the low voltage message manager, the high voltage message manager, and the point-of-use message manager are configured to communicate with any of other managers among the low voltage message manager, the high voltage message manager, and the point-of-use message manager.

15. A method for communicating with power device switches for an inverter, the method comprising:

communicating a message between a high voltage message manager of the inverter and a point-of-use message manager for the power device switches using a single-wire data bus.

16. The method of claim 15, further comprising:

measuring, with a timer of the inverter, a period of time that the single-wire data bus is in a dominant phase or a recessive phase.

17. The method of claim 16, wherein the communicating the message includes using a logic 0 bit and a logic 1 bit, wherein the logic 0 bit is defined as a dominant phase measured by the timer for a first period of time followed by a recessive phase measured for a second period of time, and the logic 1 bit is defined as a dominant phase measured by the timer for the first period of time followed by a recessive phase measured for a third period of time that is longer than the second period of time for the logic 0 bit.

18. The method of claim 17, further comprising transmitting a logic 0 bit or a logic 1 bit during the second period of time or the third period of time, to interrupt a message communication within a single bit transmission.

19. The method of claim 15, further comprising:

applying one or more of a current source or a current sink to the single-wire data bus.

20. The method of claim 19, wherein the one or more of the current source or the current sink has a higher current capability than an expected worst case externally coupled current.

* * * * *